United States Patent
Schöllhammer et al.

(10) Patent No.: US 12,328,855 B2
(45) Date of Patent: Jun. 10, 2025

(54) HOUSING COVER

(71) Applicant: ELRINGKLINGER AG, Dettingen (DE)

(72) Inventors: Jochen Schöllhammer, Dettingen (DE); Bernhard Eberle, Metzingen (DE); Tobias Kunert, Reutlingen (DE)

(73) Assignee: ELRINGKLINGER AG, Dettingen (DE)

( * ) Notice: Subject to any disclaimer, the term of this patent is extended or adjusted under 35 U.S.C. 154(b) by 64 days.

(21) Appl. No.: 17/961,509

(22) Filed: Oct. 6, 2022

(65) Prior Publication Data

US 2023/0088724 A1 Mar. 23, 2023

Related U.S. Application Data

(63) Continuation of application No. PCT/EP2021/058343, filed on Mar. 30, 2021.

(30) Foreign Application Priority Data

Apr. 8, 2020 (DE) ...................... 10 2020 109 893.6

(51) Int. Cl.
*H05K 9/00* (2006.01)
(52) U.S. Cl.
CPC .... *H05K 9/0015* (2013.01); *Y10T 428/24273* (2015.01)
(58) Field of Classification Search
CPC ................. H05K 9/0015; H05K 5/061; Y10T 428/24273
See application file for complete search history.

(56) References Cited

U.S. PATENT DOCUMENTS 5,095,773 A * 3/1992 Okuzumi .............. F16H 57/028
74/606 R
2001/0040037 A1 11/2001 Negishi
(Continued)

FOREIGN PATENT DOCUMENTS

EP 1683997 7/2006
EP 1569505 B1 11/2010
(Continued)

OTHER PUBLICATIONS

Machine Translation of JP 2004-095929 A. (Year: 2004).*
(Continued)

*Primary Examiner* — Brian Handville
(74) *Attorney, Agent, or Firm* — Hanley, Flight & Zimmerman, LLC

(57) ABSTRACT

To create a housing cover for fixing to a housing, wherein the housing cover is provided with a plurality of fastening means through openings and with a sealing bead that comprises an elastomeric material, and wherein the sealing bead is arranged on a seal support face of the housing cover, in which housing cover the course of the sealing bead can be more freely designed and, in particular, laid closer to the fastening means through-openings of the housing cover and which, in particular, is producible from a relatively thin starting material, it is proposed that the housing cover comprises at least one deformation limiting element, which projects over the seal support face in the same direction as the sealing bead and limits a deformation of the sealing bead in the assembled state of the housing cover,
wherein the deformation limiting element comprises a bending region in which the material of the deformation limiting element is bent out of a reference plane extending substantially in parallel to the seal support face by a bend angle of at least 30°.

17 Claims, 18 Drawing Sheets

(56) References Cited

U.S. PATENT DOCUMENTS

| | | |
|---|---|---|
| 2006/0169099 A1 | 8/2006 | Diez |
| 2011/0088241 A1 | 4/2011 | Eglinger et al. |
| 2012/0320544 A1 | 12/2012 | Ohhashi et al. |
| 2015/0337962 A1 | 11/2015 | Lojewski et al. |
| 2017/0013737 A1 | 1/2017 | Kawabe et al. |

FOREIGN PATENT DOCUMENTS

| | | |
|---|---|---|
| EP | 1874103 B1 | 10/2011 |
| JP | S5456754 U | 4/1979 |
| JP | H04259286 A | 9/1992 |
| JP | H08298384 A | 11/1996 |
| JP | H0942777 A | 2/1997 |
| JP | H11044362 A | 2/1999 |
| JP | H11233962 | 8/1999 |
| JP | 2004095929 | 3/2004 |
| JP | 2004146284 A | 5/2004 |
| JP | 2008117973 A | 11/2006 |
| JP | 2008218946 A | 9/2008 |
| JP | 2009026978 A | 2/2009 |
| JP | 2011071362 | 4/2011 |
| JP | 2015141991 | 8/2015 |

OTHER PUBLICATIONS

Machine Translation of JP 2011-071362 A. (Year: 2011).*
Machine Translation of JP 2015-141991 A. (Year: 2015).*
International Searching Authority, "International Search Report and Written Opinion," issued in connection with International Application No. PCT/EP2021/058343, Jul. 7, 2021, 16 pages, with English translation.
International Searching Authority, "International Preliminary Report on Patentability," issued in connection with PCT international application No. PCT/EP2021/058343, dated Oct. 20, 2022, 16 pages, with English translation.
German Patent and Trademark Office, "Search Report," issued in connection with German Patent Application No. 102020109893.6, mailed May 11, 2023, 15 pages, with English machine translation.
European Patent Office, "Communication Pursuant to Rule 71(3) EPC," issued in connection with European Patent Application No. 21716347.6, dated Apr. 29, 2025, 12 pages. [English Machine Translation Included].

* cited by examiner

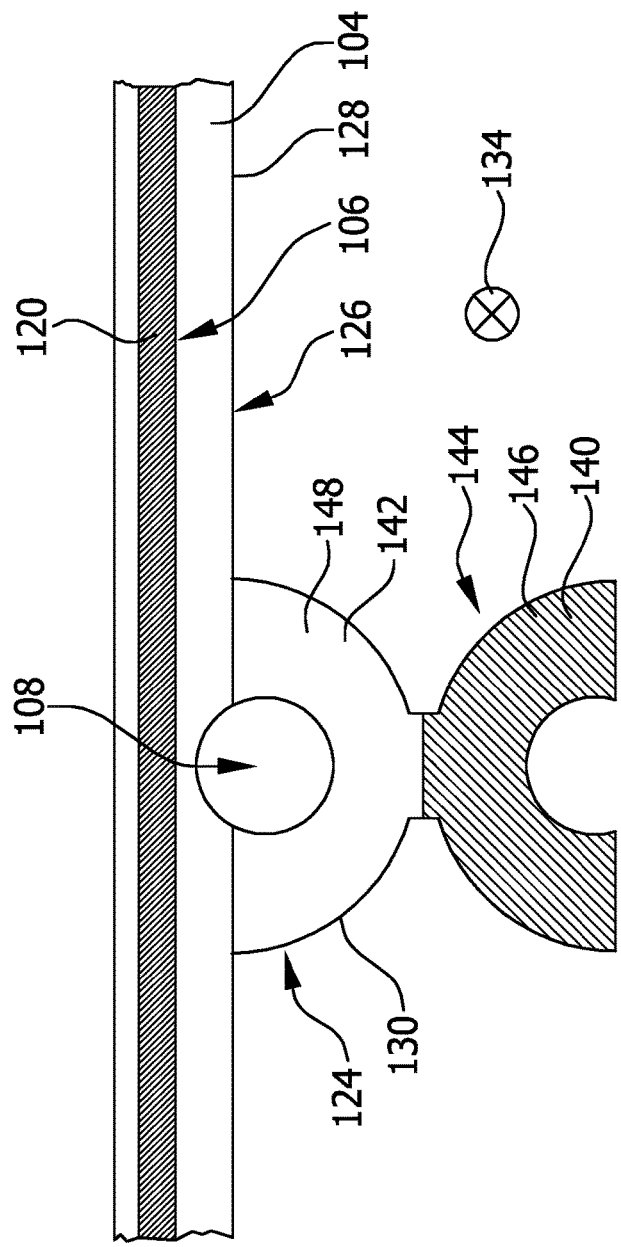
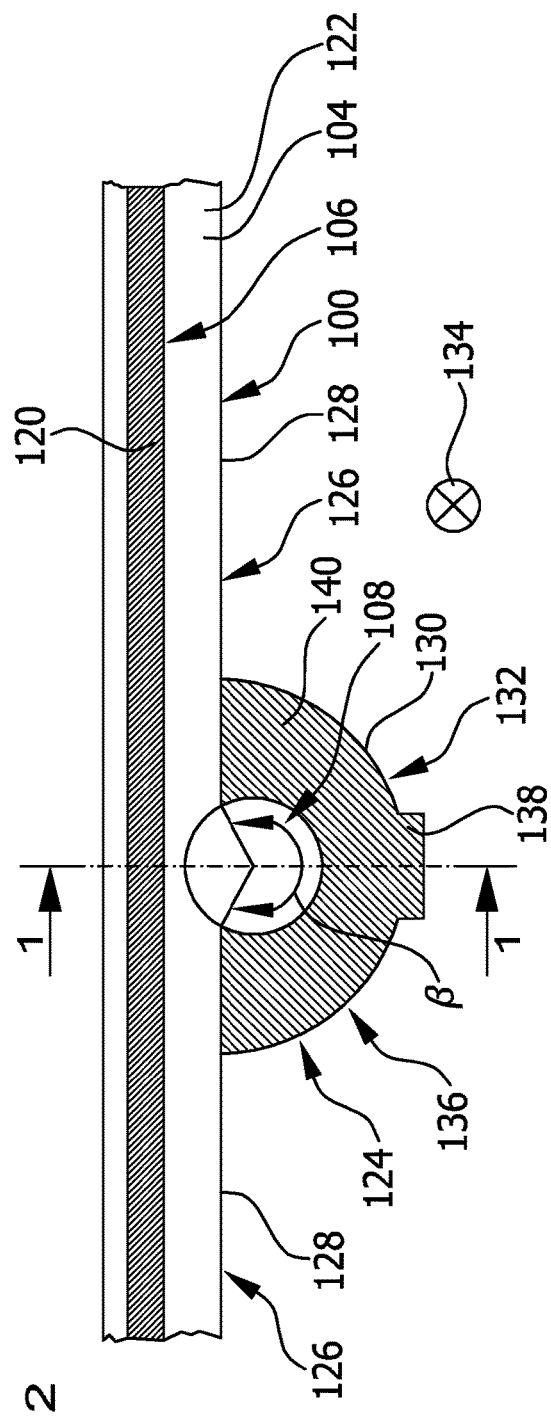
FIG.3
FIG.2

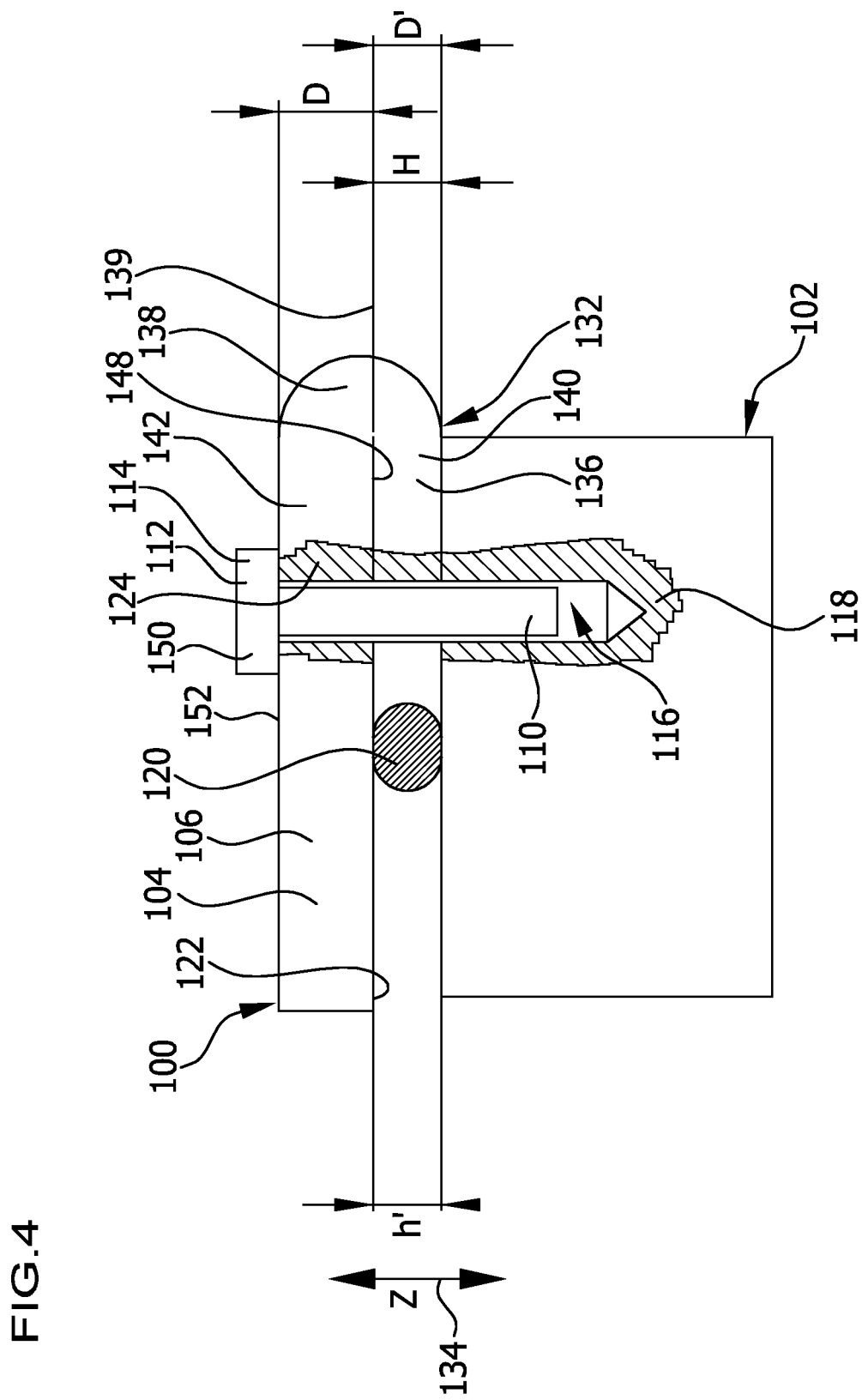

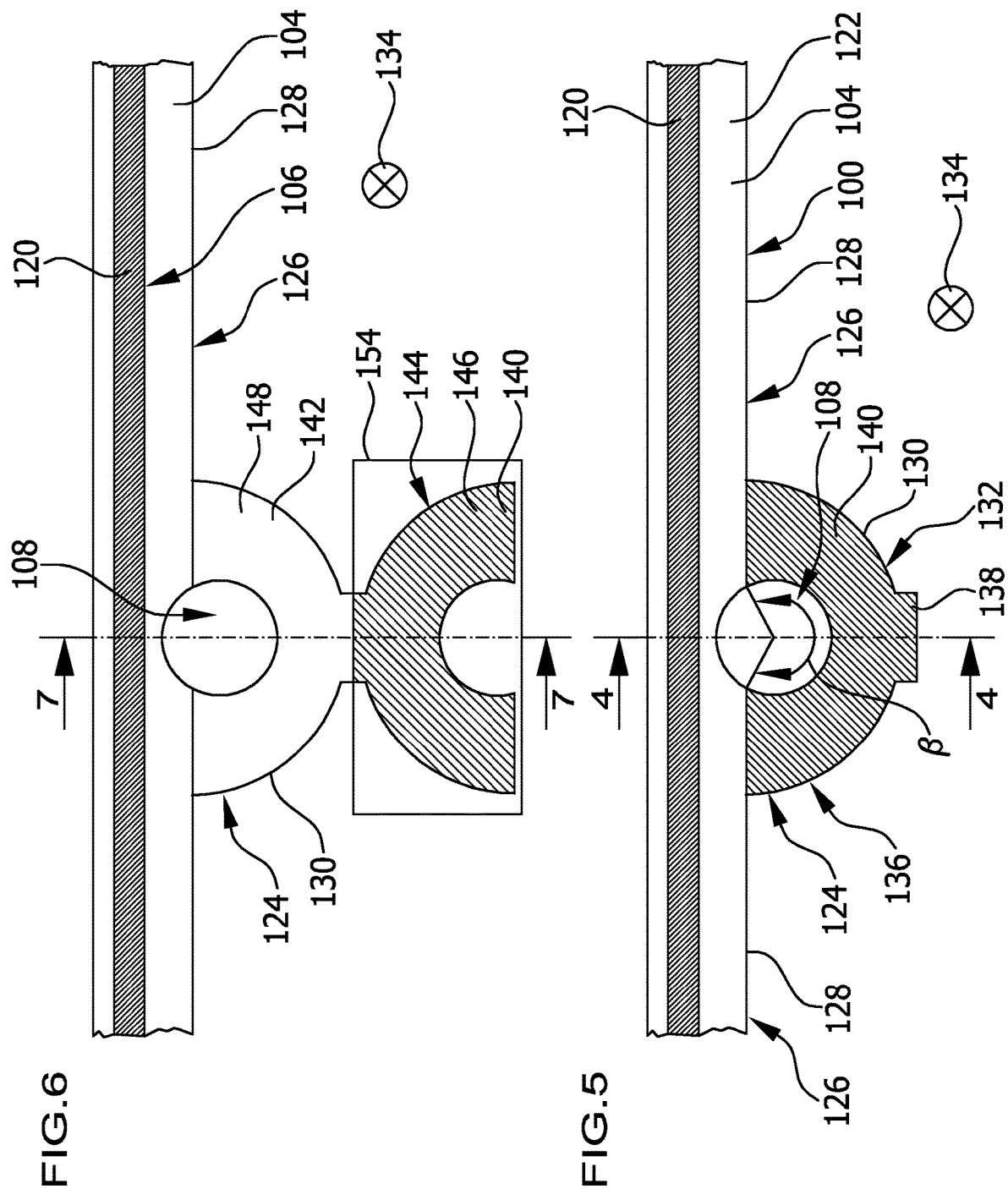

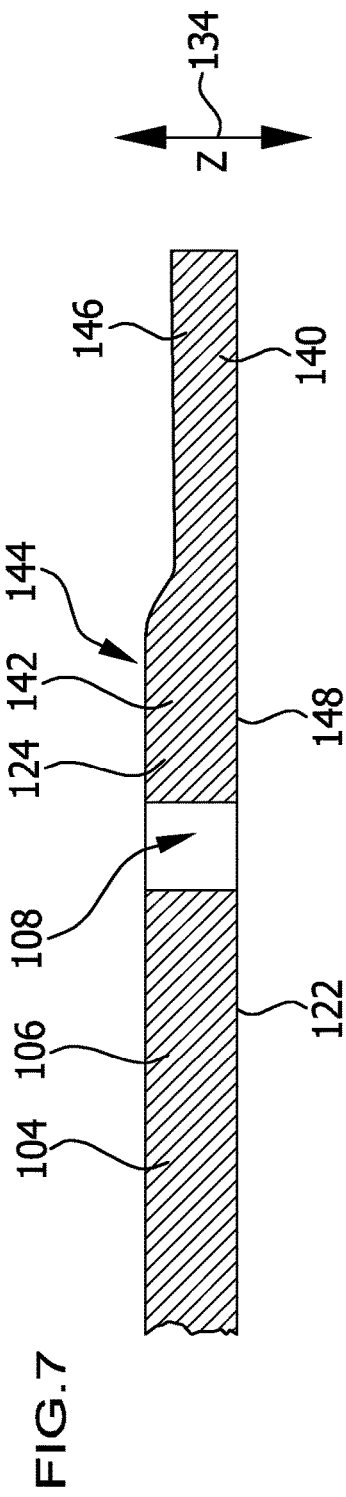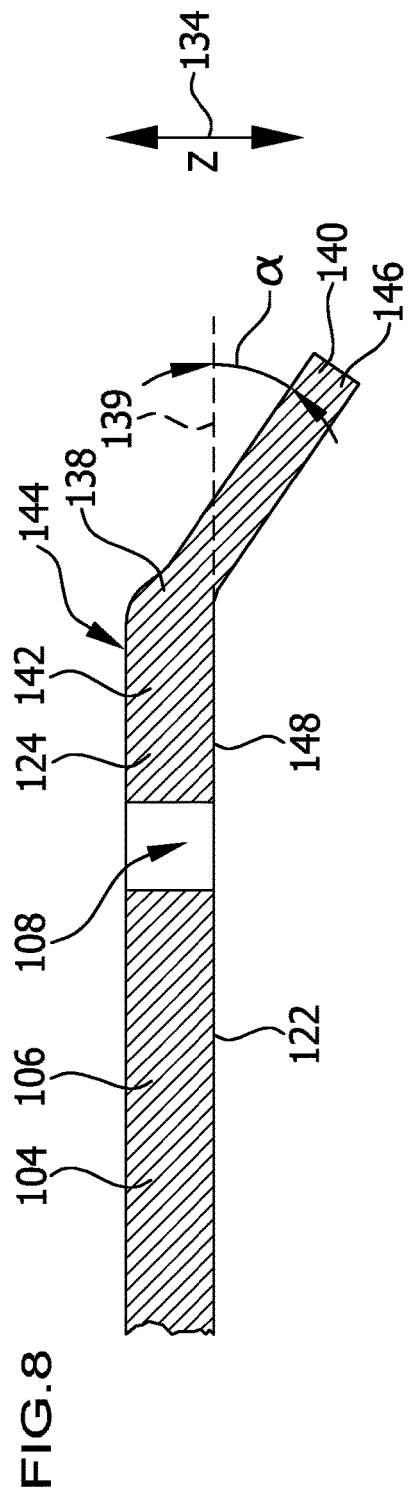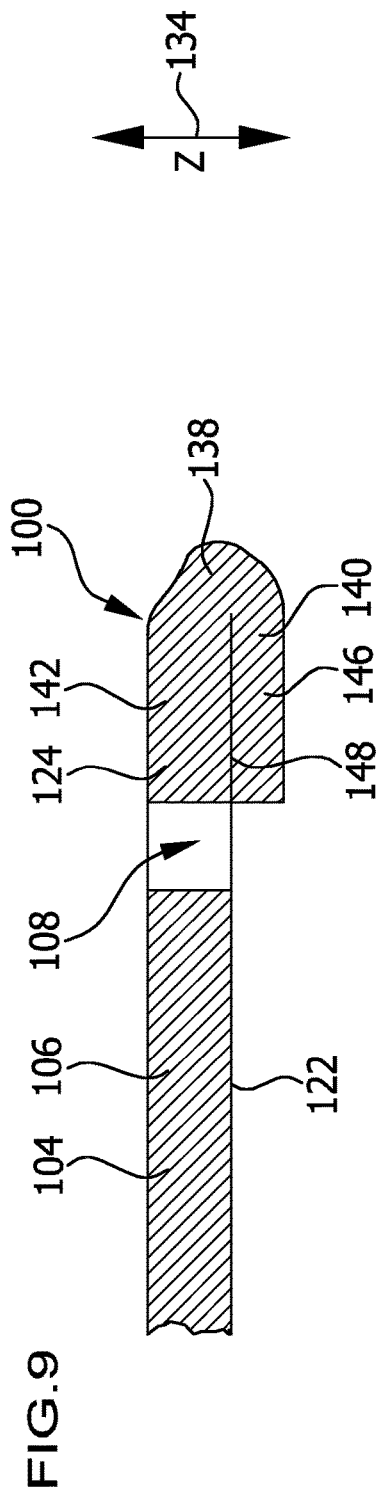

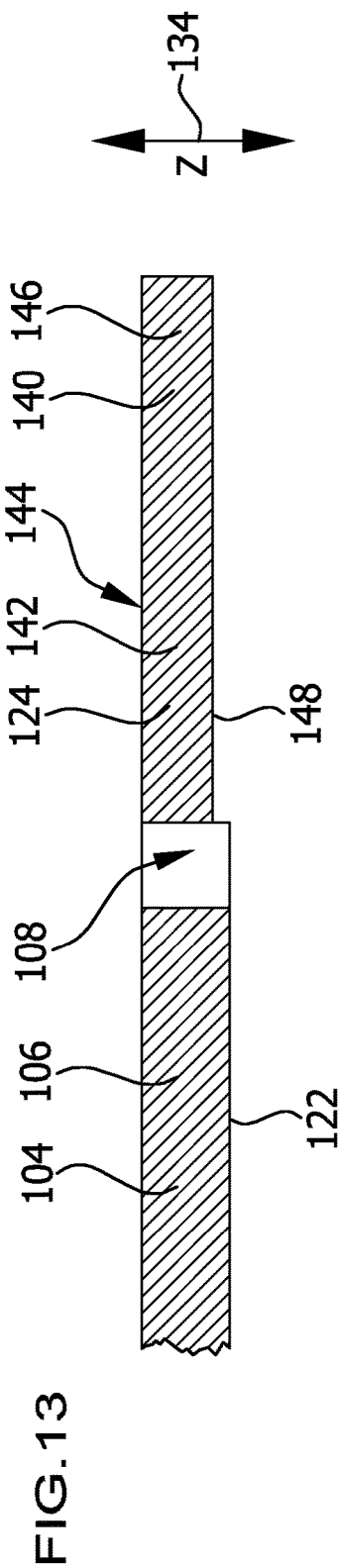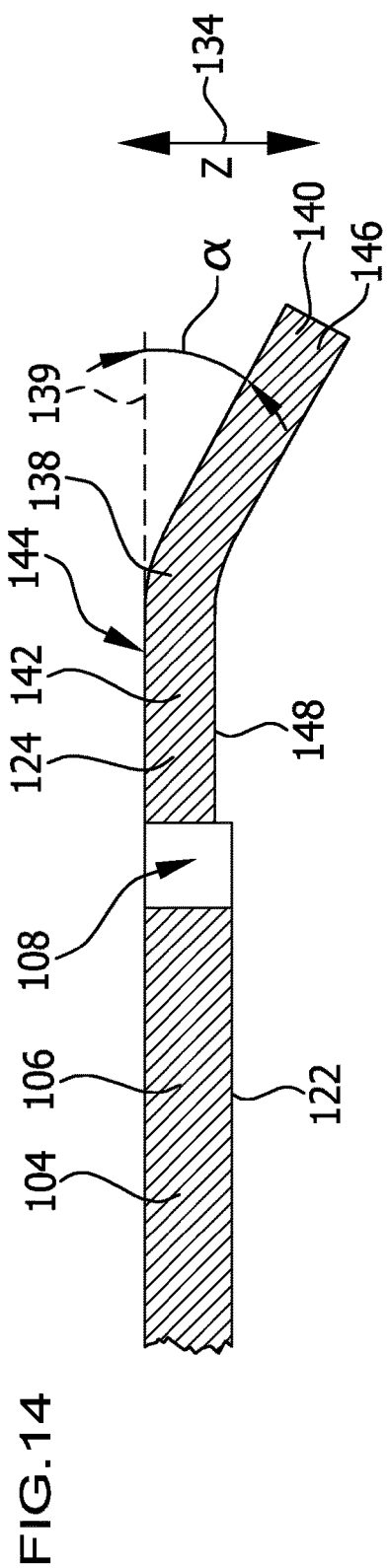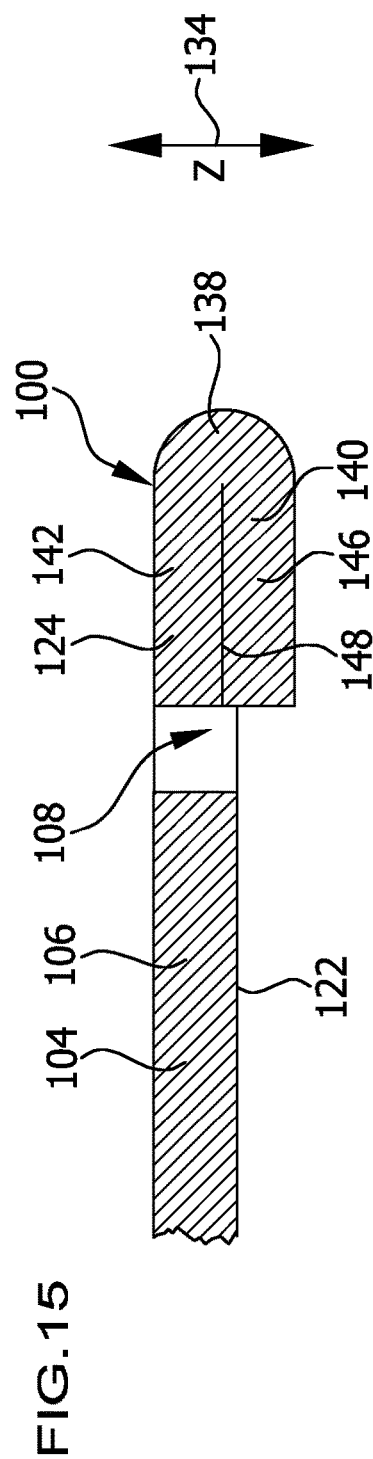

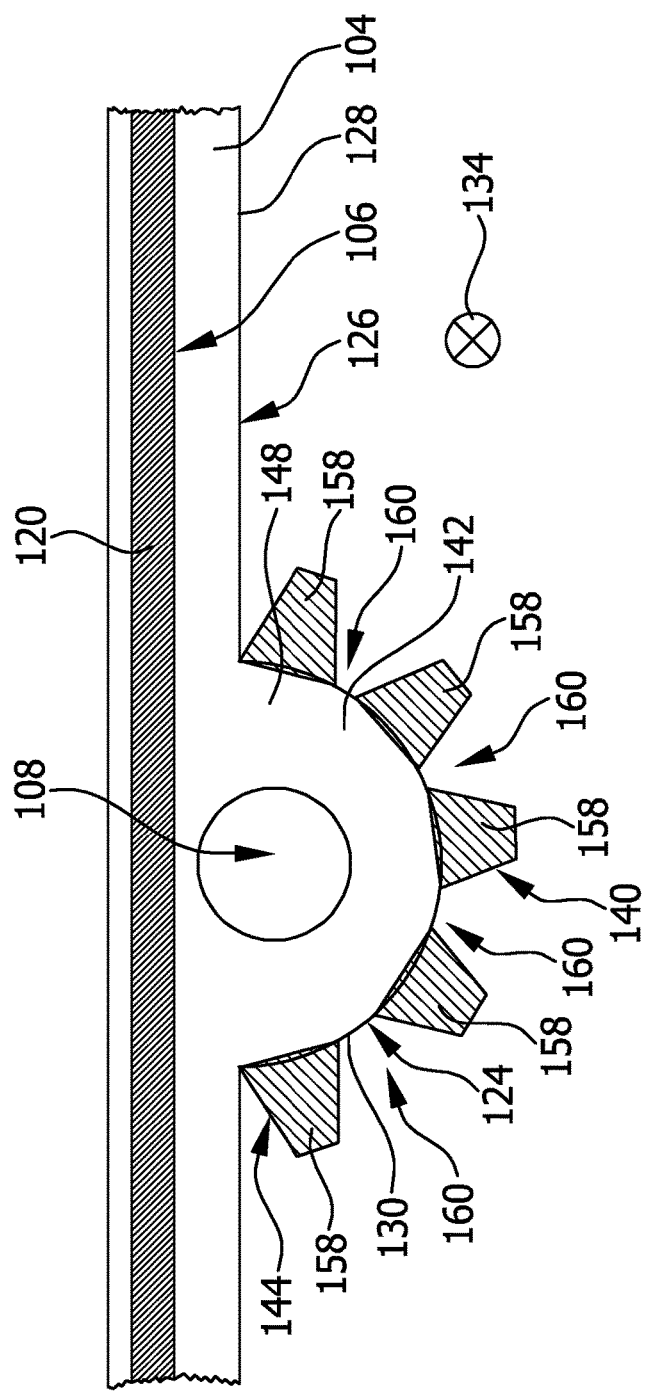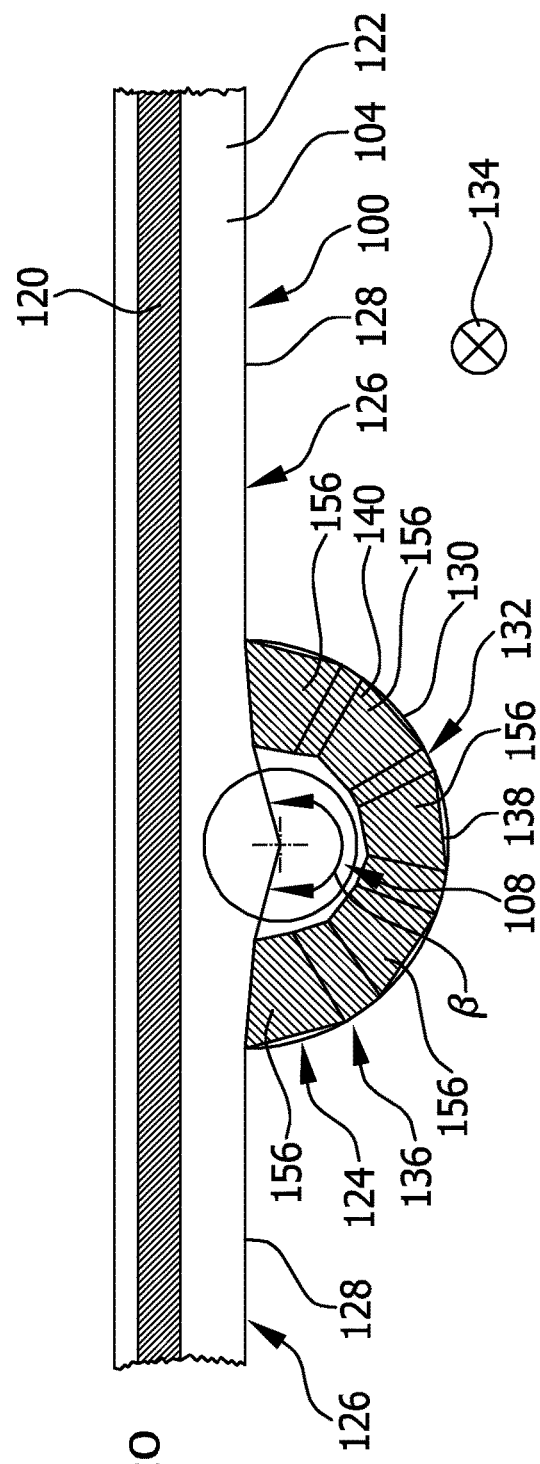

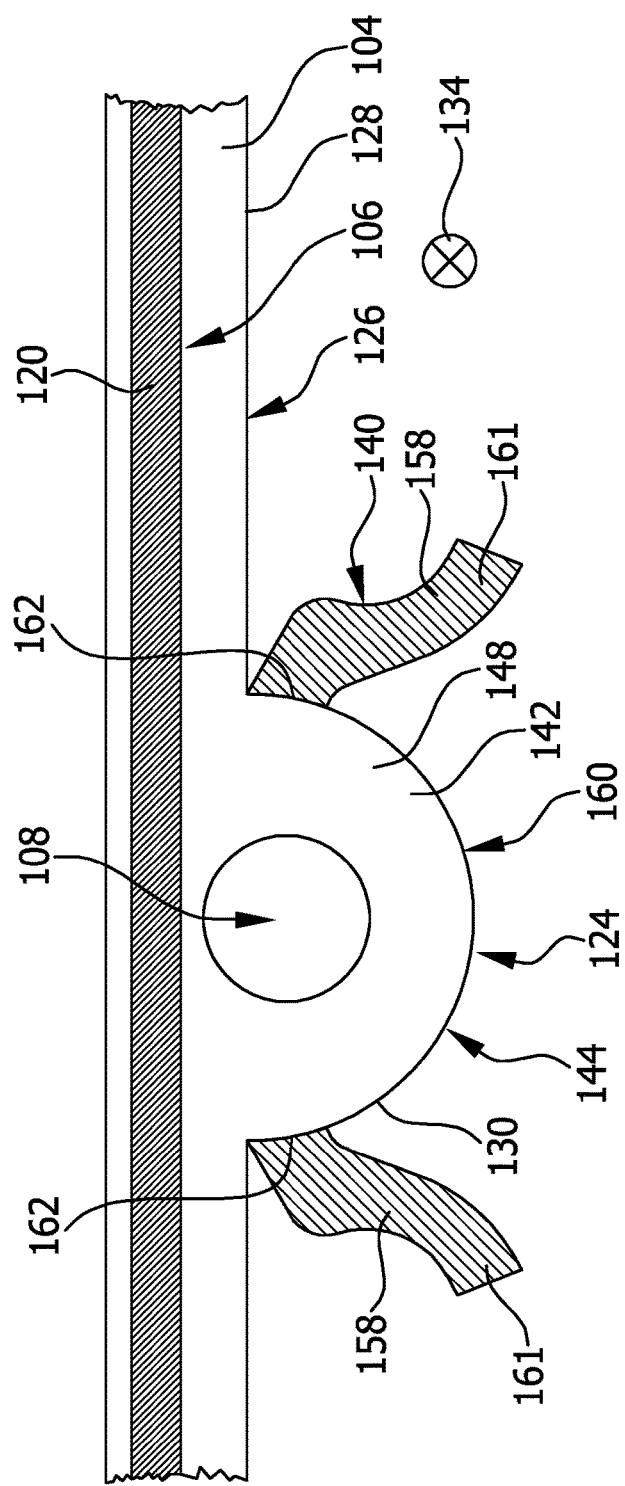
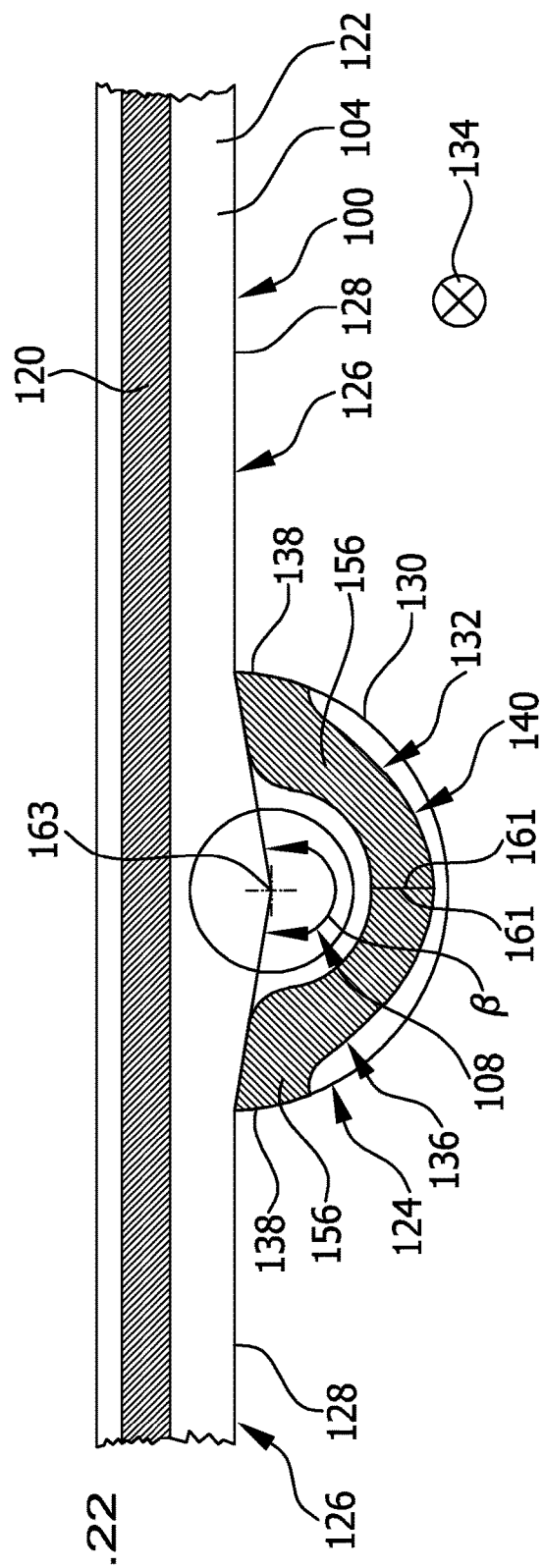
FIG.23
FIG.22

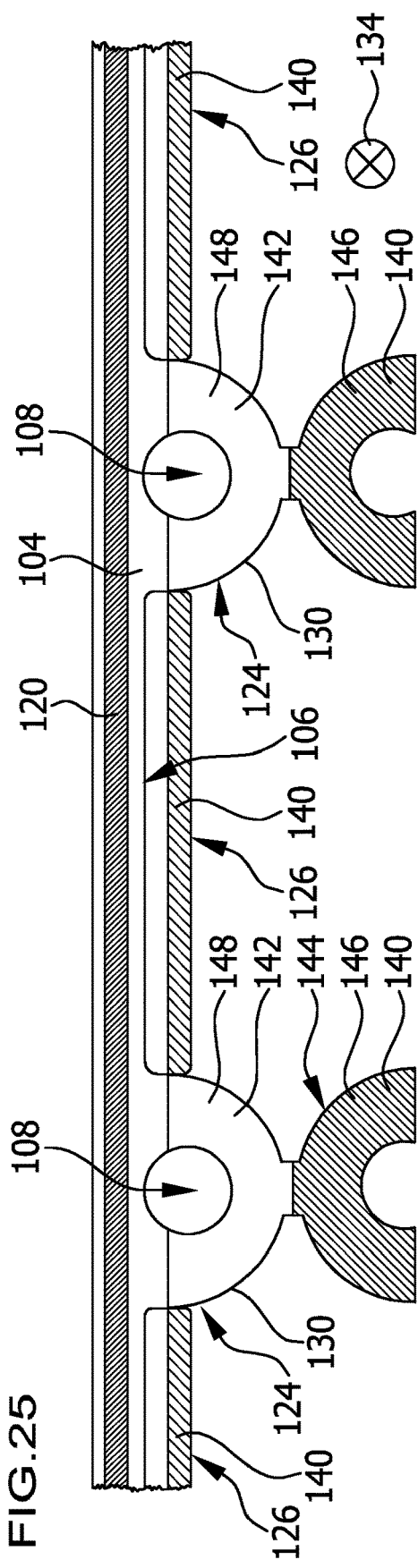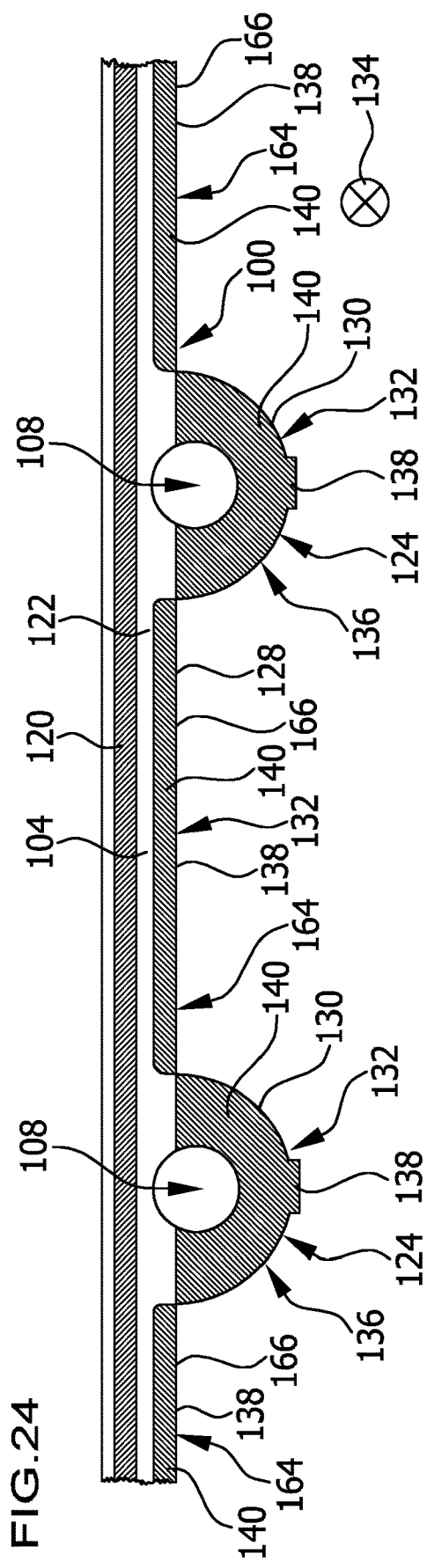

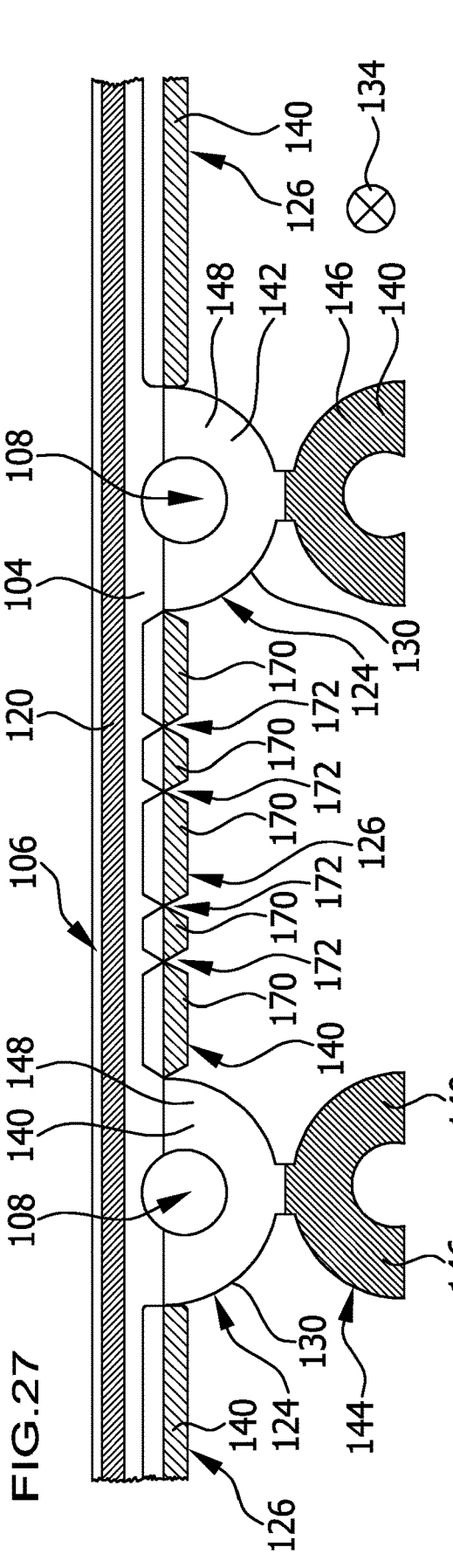
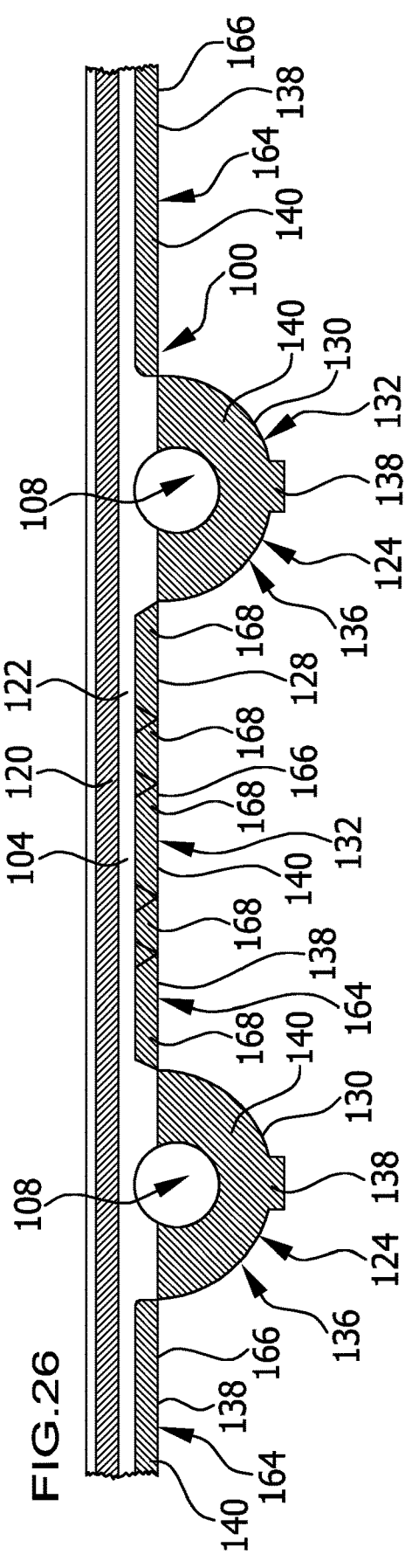

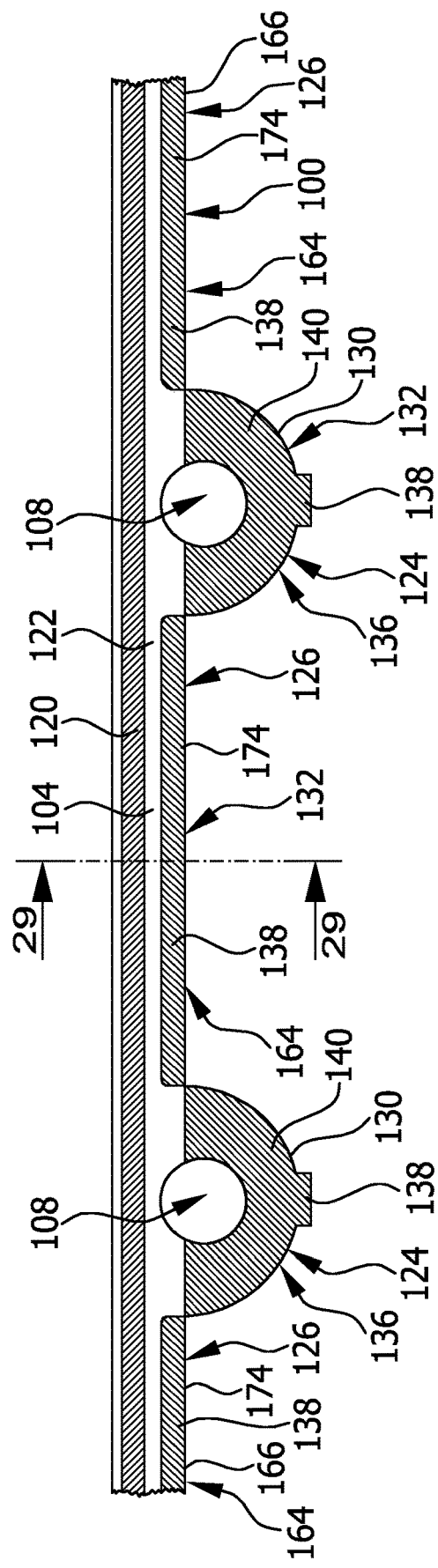

HOUSING COVER

RELATED APPLICATIONS

This application is a continuation of international application number PCT/EP2021/058343 filed on 30 Mar. 2021 and claims the benefit of German application number 10 2020 109 893.6 filed on 8 Apr. 2020.

The present disclosure relates to the subject matter disclosed in international application number PCT/EP2021/058343 of 30 Mar. 2021 and German application number 10 2020 109 893.6 of 8 Apr. 2020, which are incorporated herein by reference in their entirety and for all purposes.

FIELD OF THE DISCLOSURE

The present invention relates to a housing cover for fixing to a housing, wherein the housing cover is provided with a plurality of fastening means through-openings and with a sealing bead that comprises an elastomeric material, and wherein the sealing bead is arranged on a seal support face of the housing cover.

EP 1 683 997 A2 discloses a housing cover, in which a sealing bead made of an elastomeric material is arranged in a groove impressed in the housing cover.

Due to the requirement of providing a groove in the housing cover, the width of which in the non-pressed state of the housing cover has to be greater than the width of the sealing bead, the freedom in the design of the housing cover is limited.

SUMMARY OF THE INVENTION

In accordance with an embodiment of the invention, a housing cover of the kind stated at the outset is created, in which the course of the sealing bead can be more freely designed and, in particular, can be laid more closely to the fastening means through-openings of the housing cover and which, in particular, is also producible from a relatively thin starting material.

In accordance with an embodiment of the invention, provision is made in a housing cover with the features of the preamble of claim 1 that the housing cover comprises at least one deformation limiting element, which projects over the seal support face in the same direction as the sealing bead and limits a deformation of the sealing bead in the assembled state of the housing cover, wherein the deformation limiting element comprises a bending region in which the material of the deformation limiting element is bent out of a reference plane extending substantially in parallel to the seal support face by a bend angle of at least 30°.

In the housing cover in accordance with the invention, in the assembled state of the housing cover, in which the sealing bead is pressed between the housing cover and the housing to be closed by means of the housing cover, the deformation limiting element is in the main force fit and the sealing bead is in the secondary force fit. This prevents an excessive deformation of the sealing bead.

In principle, the at least one deformation limiting element may be produced, for example, by an embossing operation or a deep-drawing operation on a base body of the housing cover.

The production of a deformation limiting element, which typically has a height of, e.g., 1.0 mm, on a sheet-shaped starting material that has a small material thickness of, for example, 1.5 mm or less, is problematic due to the material weakening in this region as a result of the embossing operation.

It is therefore advantageous that, in accordance with the present invention, instead of an embossing operation or a deep-drawing operation, a bending operation is used to produce the deformation limiting element.

By producing the at least one deformation limiting element by means of a bending operation, it is easily possible to produce a deformation limiting element that projects by a height H of about 1.0 mm over the seal support face on a starting material with a material thickness of 1.5 mm or less without weakening the material of the housing cover in the bending region.

In a particular embodiment of the invention, provision is made that the bend angle α in the bending region is substantially 90°.

In this case, an end region of the bending region remote from the seal support region is thus moved substantially perpendicular to the seal support face in the direction pointing to the housing in the assembled state of the housing cover without folding over a region of the housing cover onto another region of the housing cover.

The deformation limiting element can hereby be of very space-saving configuration.

This embodiment of the deformation limiting element is suited, in particular, for producing a deformation limiting element in an intermediate fastening means through-opening region of the housing cover arranged between two fastening means through-openings of the housing cover.

The bending region preferably ends at an end face with which the housing cover can be placed against the housing.

In another embodiment of the invention, provision is made that the bend angle α is more than 160°, particularly preferably about 180°.

The deformation limiting element hereby preferably comprises a folding over region, which is connected, preferably in one piece, by way of the bending region and an abutment region to a seal support region of the housing cover on which the sealing bead is arranged, wherein the folding over region abuts against the abutment region on the same side of the housing cover on which the sealing bead is arranged on the seal support region.

The folding over region abuts, preferably in surface-to-surface contact, particularly preferably in complete surface-to-surface contact, against the abutment region of the housing cover.

The average thickness of the folding over region may be substantially equal to the average thickness of the abutment region.

The thickness of the folding over region and the thickness of the abutment region may hereby correspond to the thickness of the starting material from which the housing cover is made.

This starting material is preferably a sheet-shaped material.

Furthermore, the starting material is preferably a metallic material.

For example, the starting material may comprise aluminum, in particular as its main component.

The starting material may be an aluminum alloy.

Furthermore, provision may be made that the starting material is a steel material, preferably a stainless steel material.

In a particular embodiment of the invention, provision is made that the average thickness of the folding over region is smaller than the average thickness of the abutment region.

The thickness of the folding over region may hereby be reduced in comparison to the thickness of the abutment region, for example by means of a grading operation. Preferably no grading operation is performed in the abutment region or a grading operation is performed that has a smaller degree of deformation than the grading operation performed on the folding over region.

In this case, the thickness of the abutment region may be equal to the thickness of the seal support region or smaller than the thickness of the seal support region.

In a particular embodiment of the invention, provision is made that the thickness of the folding over region varies with increasing distance from the bending region.

In particular, provision may be made that the thickness of the folding over region decreases with increasing distance from the bending region.

The thickness of the folding over region may vary continuously, preferably linearly, in dependence on the distance from the bending region.

Furthermore, in a particular embodiment of the invention, provision is made that the thickness of the abutment region varies with increasing distance from the bending region.

Provision is preferably made that the thickness of the abutment region increases with increasing distance from the bending region.

The thickness of the abutment region may vary continuously, preferably linearly, in dependence on the distance from the bending region.

In a particularly preferable embodiment of the invention, provision is made that the sum $D_G$ of the local thickness $D_U$ of the folding over region and the local thickness $D_A$ of the abutment region is substantially independent of the distance from the bending region and thus is preferably substantially constant.

In an embodiment of the housing cover in accordance with the invention that can be produced in a very simple manner, provision is made that the thickness of the folding over region and the thickness of the abutment region are substantially equal to the thickness of the seal support region and preferably substantially equal to the thickness of the starting material from which the housing cover is made.

In this case, the bending operation for producing the bending region can be performed without first performing a grading operation to reduce a thickness of the abutment region and/or to reduce a thickness of the folding over region.

However, in such an embodiment of the housing cover, the height H of the deformation limiting element over the seal support face is predetermined by the thickness of the starting material.

In a particular embodiment of the housing cover, provision is thus made that the thickness of the folding over region and/or the thickness of the abutment region is smaller than the thickness of the seal support region at least in sections.

It is hereby possible to configure the deformation limiting element such that the thickness H of the deformation limiting element over the seal support face is smaller than the thickness of the starting material.

The at least one deformation limiting element may comprise at least one fastening means through-opening portion, which extends along a circumferential direction of one of the fastening means through-openings over circumferential angle β around the respective fastening means through-opening.

This circumferential angle is preferably smaller than 360°.

The circumferential angle β, which is determined in relation to the longitudinal central axis of the respective fastening means through-opening, is preferably more than 90°, in particular more than 120°, particularly preferably more than 160°.

Furthermore, the circumferential angle β, which is determined in relation to the longitudinal central axis of the respective fastening means through-opening, is preferably less than 270°, particularly preferably less than 200°.

Furthermore, provision may be made that the at least one deformation limiting element comprises at least one intermediate fastening means through-opening portion, which extends along a peripheral direction of a rim portion of the housing cover located between two fastening means through-openings.

The rim portion of the housing cover located between two of the fastening means through-openings may be of substantially rectilinear or curved configuration.

The intermediate fastening means through-opening portion of the deformation limiting element preferably extends over more than half the length of the rim portion of the housing cover located between the two fastening means through-openings, in particular over more than three fourths the length of this rim portion, particularly preferably over more than 90% of the length of this rim portion.

The intermediate fastening means through-opening portion of the deformation limiting element may have at least one outlet opening and/or end at at least one outlet opening.

Such an outlet opening produces a fluidic connection from the intermediate region between the sealing bead and the intermediate fastening means through-opening portion of the deformation limiting element to the outside space of the housing cover, such that moisture or liquid that enters into or arises in this intermediate region of the housing cover can discharge through the at least one outlet opening into the outside space of the housing cover and thus prevent corrosion due to such a collection of moisture or liquid in the intermediate region of the housing cover.

The intermediate fastening means through-opening portion of the deformation limiting element may adjoin, in particular, at one of its end regions or at both end regions on a respective outlet opening, which is delimited opposite the intermediate fastening means through-opening portion by a fastening means through-opening portion of the deformation limiting element.

In particular, such an outlet opening may thus have the form of a gap or an opening between an intermediate fastening means through-opening portion of the deformation limiting element and a fastening means through-opening portion of the deformation limiting element.

The at least one fastening means through-opening portion and/or the at least one intermediate fastening means through-opening portion of the deformation limiting element may comprise a plurality of segments, between which at least one gap is arranged in an initial state of the housing cover before producing the bending region.

In the operational state of the housing cover, after producing the bending region, the at least one gap between the plurality of segments of the deformation limiting element, in particular the folding over region of the deformation limiting element, may be closed.

Furthermore, provision may be made that in the operational state of the housing cover, at least two respective ones of the segments of the deformation limiting element are pressed together.

By means of such pressing, in particular, a merging of the material of at least two respective ones of the segments of the deformation limiting element with one another can be brought about.

The folding over region of the deformation limiting element formed from the segments of the deformation limiting element may be of one-part configuration in the operational state of the housing cover.

The housing to which the housing cover in accordance with the invention is fixable may be, in particular, a housing of an electrical device, for example of an electrical control device, a housing of an inverter, or a housing of an electrical drive unit, for example of an electric vehicle.

The housing cover in accordance with the invention is suitable for use as part of an assembly, which comprises the housing and the housing cover in accordance with the invention.

By subdividing the folding over region of the deformation limiting element into a plurality of segments, it is possible to form a deformation limiting element with such a folding over region on a rectilinear rim portion of the housing cover or on a curved rim portion of the housing cover.

A component weakening of the housing cover is avoided, because the segments of the folding over region are located outside the component contour of the housing cover and are folded over onto an abutment region of the housing cover located within the component contour.

As a result, deformation limiting elements that are very space-saving and are flexible in use can be produced on a housing cover, the starting material of which has a material thickness of 1.5 mm or less, without weakening the material of the housing cover by embossing.

The deformation limiting element, also referred to as a stopper, serves to compress the sealing bead, for example a CIP ("cured in place") sealing bead, to a defined measure and to prevent an over-compression of the seal.

In the outer contour of the housing cover, tabs may be provided that are placed partially around a respective associated fastening means through-opening, for example a screw eye.

The contact face on which the fastening means, for example a fastening screw, abuts in the assembled state of the housing cover is located on the substantially planar side of the housing cover that is not folded over, such that a full-surface contact between the fastening means, in particular the head of a fastening screw, and the housing cover can be ensured.

The thickness of the abutment region, the bending region, and/or the folding over region can be reduced, compared to the initial material thickness of the starting material from which the housing cover is made, by means of a reshaping operation, preferably by means of a grading operation, before or after the bending operation.

The grading operation is performed on the starting material, preferably from the sheet inside in the direction toward the sheet outside, such that no height difference or edge has to be overcome when folding over the folding over region onto the abutment region.

By reducing the thickness of the abutment region and/or the folding over region compared to the material thickness of the starting material, it can be achieved that the height H by which the deformation limiting element projects over the seal support face on which the sealing bead is arranged is smaller than the material thickness or thickness of the starting material.

This is achieved without intervening into the material structure of the housing cover, because the folding over region is moved from outside to inside.

This thickness of the folding over region and/or of the abutment region is preferably reduced by at least 10%, in particular by at least 20%, particularly preferably by at least 30%, relative to the thickness of the starting material.

The degree to which the thickness of the starting material is reduced in the region of the abutment region and/or in the region of the folding over region may vary within the abutment region, within the folding over region, and/or between the abutment region and the folding over region.

A substantially linear variation of the degree of reshaping can be achieved, e.g., by using a wedge-shaped grading tool.

In particular, provision may be made that the average thickness of the reshaped region is smaller than the average thickness of the abutment region. The material displacement in the abutment region is hereby kept to a minimum and the high degree of reshaping is shifted to the folding over region. This offers the advantage that excess material is pressed only to a small extent in the direction toward the sealing bead and/or in the direction toward the fastening means through-opening.

The desired contour of the folding over region is ensured despite the high material displacement in the folding over region by the folding over region being separated out of the starting material, in particular cut out or punched out, only after the reshaping operation to reduce the thickness of the folding over region, for example after a grading operation.

If the folding over region is of one-part configuration before the bending operation by means of which the folding over region is folded over onto the abutment region, the deformation limiting element thus produced is referred to as a "folded over stopper".

If the folding over region is subdivided into a plurality of individual segments before the bending operation, the deformation limiting element thus produced is referred to as a "segment stopper".

A deformation limiting element with a folding over region subdivided into a plurality of segments is preferably provided on a curved portion of the outer contour of the housing cover.

Provision may be made that the segments, after folding over onto the abutment region, are pressed together such that the material of the segments merges and forms a folding over region of the operational housing cover with a continuous surface.

The segments of a folding over region may be reduced in their thickness, just like a one-part folding over region, in particular by grading, in order to set a desired height H of the deformation limiting element over the seal support face.

A one-part folding over region or a folding over region subdivided into segments may also be reduced in its thickness, for example by a grading operation, after the bending operation by which the folding over region is folded over onto the abutment region.

A deformation limiting element may also be provided in the intermediate screw region, i.e., in an intermediate fastening means through-opening region of the housing cover.

In this region, the deformation limiting element may serve to protect the sealing bead from outside influences, for example to protect against the ingress of contamination, aggressive media, and or media under high pressure into the region of the sealing bead.

In addition, the deformation limiting element may produce an electrically conductive, in particular metallically conductive, contact between the housing cover and the housing and thereby fulfill the function of EMC (electromagnetic compatibility) protection.

Even when arranged in the intermediate fastening means through-opening region of the housing cover, the abutment region and/or the folding over region of the deformation limiting element may be profiled in their thickness, for example by means of a grading operation.

Furthermore, the folding over region of the deformation limiting element may be subdivided into a plurality of segments even when the deformation limiting element is arranged in the intermediate fastening means through-opening region.

Furthermore, it is favorable if the height H of the deformation limiting element over the seal support face increases with increasing distance from the nearest fastening means through-opening. As a result of the topography of the deformation limiting element designed in that way, the variation of the surface pressure with which the housing cover is braced by means of the fastening means, in particular fastening screws, passing through the fastening means through-openings, in the longitudinal direction of the sealing bead, which is caused by the varying distances from the respective nearest fastening means, is at least partially equalized and thus an even abutment of the sealing bead on the housing to be closed is achieved at every point of the sealing bead.

The topography of the deformation limiting element may be produced before and/or after the bending operation.

If the deformation limiting element comprises no folding over region, but rather the bend angle of the bending region is only about 90°, such that the bending region abuts with an end face against the housing in the assembled state of the housing cover, this thus offers the advantage of a particularly space-saving structure of the deformation limiting element.

Such a deformation limiting element may be arranged both in a fastening means through-opening region of the housing cover and in an intermediate fastening means through-opening region of the housing cover.

Such a deformation limiting element offers mechanical protection for the sealing bead from contamination, from aggressive media, and/or from media under high pressure (for example from a high-pressure water jet), which otherwise could enter from the outside space of the housing up to the sealing bead.

In addition, such a deformation limiting element offers an EMC optimization as a result of the good electrically conductive contact between the housing cover and the housing in the assembled state of the housing cover.

A deformation limiting element, the bending region of which has a bend angle of about 90°, has no material weakening as a result of an embossing operation or a cranking operation.

Furthermore, with such a deformation limiting element no grading operation is required to set a desired height H of the deformation limiting element over the seal support face.

A deformation limiting element with a bending region that has a bend angle of about 90° is suitable in particular when the housing cover is made from a starting material with a material thickness of 2.0 mm or less.

The use of a deformation limiting element with a bending region, the bend angle of which is about 180° and which comprises a folding over region that abuts, preferably is surface-to-surface contact, against an abutment region of the housing cover, is suitable in particular when the housing cover is made from a starting material with a material thickness of 1.0 mm to 1.5 mm.

Further features and advantages of the invention are subject matter of the subsequent description and the graphical representation of exemplary embodiments.

BRIEF DESCRIPTION OF THE DRAWINGS

FIG. 2 shows a plan view of the rim region of the housing cover from FIG. 1, with the viewing direction toward the seal support face of the housing cover facing toward the housing in the assembled state of the housing cover;

FIG. 3 shows a plan view of the rim region of a housing cover preform from which the housing cover according to FIGS. 1 and 2 is produced by means of a bending operation;

FIG. 4 shows a cut corresponding to FIG. 1 along line 4-4 in FIG. 5 through a rim region of a second embodiment of a housing cover in which the thickness of the folding over region is smaller than the thickness of the abutment region and is smaller than the thickness of the seal support region;

FIG. 5 shows a view of the rim region of the housing cover from FIG. 4;

FIG. 6 shows a plan view of the rim region of a housing cover preform of the second embodiment of a housing cover with the viewing direction toward the seal support face of the housing cover;

FIG. 7 shows a cut through the rim region of the housing cover preform from FIG. 6 along line 7-7 in FIG. 6, without the sealing bead, the thickness of the folding over region having been reduced by means of a grading operation in comparison to the thickness of the abutment region and the thickness of the seal support region;

FIG. 8 shows a cut corresponding to FIG. 7 through the rim region of the housing cover preform after the production of the bending region has begun and material of the deformation limiting element has been bent out of the reference plane of the housing cover extending in parallel to the seal support face by an acute angle α;

FIG. 9 shows a cut corresponding to FIGS. 7 and 8 through the rim region of the housing cover after the bending operation to produce the bending region is completed, material of the deformation limiting element has been bent out of a reference plane extending in parallel to the seal support face by a bend angle of 180°, and the folding over region abuts in surface-to-surface contact against the abutment region of the housing cover;

FIG. 13 shows a cut through the rim region of the housing cover preform from FIG. 12 along line 13-13 in FIG. 12, the thickness of the folding over region and the thickness of the abutment region having been reduced by means of a grading operation in comparison to the thickness of the seal support region;

FIG. 14 shows a cut corresponding to FIG. 13 through the rim region of the housing cover preform after a bending operation to produce the bend region has begun and material of the deformation limiting element in the bending region has been bent out of a reference plane extending in parallel to the seal support face by an acute angle α;

FIG. 15 shows a cut corresponding to FIGS. 13 and 14 through the rim region of the third embodiment of the housing cover after the bending operation to produce the bending region is completed, material of the deformation limiting element has been bent out of the reference plane extending in parallel to the seal support face by a bend angle of 180°, and the folding over region abuts in surface-to-surface contact against the abutment region of the housing cover;

FIG. 20 shows a plan view of a rim portion of a fifth embodiment of a housing cover in which the deformation limiting element comprises a fastening means through-opening portion that extends along a circumferential direction of one of the fastening means through-openings over a circumferential direction of about 180° around the respective fastening means through-opening and the fastening means through-opening portion of the deformation limiting element comprises a plurality, for example five, segments that are pressed together, with the viewing direction toward the seal support face of the housing cover;

FIG. 21 shows a plan view corresponding to FIG. 20 of a rim portion of a housing cover preform, the folding over region of which comprises a plurality of segments that succeed one another in the circumferential direction of a fastening means through-opening and are spaced apart from one another by a respective intermediate gap, with the viewing direction toward the seal support face of the housing cover preform;

FIG. 22 shows a plan view of a rim portion of a sixth embodiment of a housing cover in which the deformation limiting element comprises a fastening means through-opening portion that extends along a circumferential direction of a fastening means through-opening over a circumferential angle of about 180° around the respective fastening means through-opening, the fastening means through-opening portion comprising two segments that abut against one another in the operational state of the seal;

FIG. 23 shows a plan view corresponding to FIG. 22 of a rim portion of a housing cover preform of the sixth embodiment of a housing cover from FIG. 22, the folding over region of the housing cover preform comprising two segments that succeed one another in the circumferential direction of a fastening means through-opening and are spaced apart from one another by an intermediate gap, with the viewing direction toward the seal support face of the housing cover preform;

FIG. 24 shows a plan view of a rim region of a seventh embodiment of a housing cover in which the deformation limiting element comprises a plurality of fastening means through-opening portions that each extend along a circumferential direction of one of the fastening means through-openings over a circumferential angle around the respective fastening means through-opening, and the deformation limiting element further comprising intermediate fastening means through-opening portions that each extend along a peripheral direction of a rim portion of the housing cover located between two of the fastening means through-openings, the intermediate fastening means through-opening portions of the deformation limiting element each being of one-part configuration, with the viewing direction toward the seal support face of the housing cover;

FIG. 25 shows a plan view corresponding to FIG. 24 of a rim region of a housing cover preform of the seventh embodiment of a housing cover from FIG. 24, which shows the folding over regions of the fastening means through-opening portions and the intermediate fastening means through-opening portions of the deformation limiting element before the bending operation by means of which the bending regions of the housing cover are produced;

FIG. 26 shows a plan view of a rim region of an eighth embodiment of a housing cover in which the deformation limiting element comprises a plurality of fastening means through-opening portions that each extend along a circumferential direction of one of the fastening means through-openings over a circumferential angle around the respective fastening means through-opening, and the deformation limiting element comprises a plurality of intermediate fastening means through-opening portions that each extend along a peripheral direction of a rim portion of the housing cover located between two of the fastening means through-openings, the fastening means through-opening portions of the deformation limiting element each being of one-part configuration, and at least one intermediate fastening means through-opening portion of the deformation limiting element comprises a plurality of segments that succeed one another along the peripheral direction of a rim portion of the housing cover and are pressed together, with the viewing direction toward the seal support face of the housing cover;

FIG. 27 shows a plan view corresponding to FIG. 26 of a rim region of a housing cover preform of the eighth embodiment of a housing cover from FIG. 26, a folding over region of at least one of the intermediate fastening means through-opening portions of the deformation limiting element comprising a plurality of segments that succeed one another in the peripheral direction of a rim portion of the housing cover preform, a respective gap being arranged between two respective segments, with the viewing direction toward the seal support face of the housing cover preform;

FIG. 28 shows a plan view of a rim portion of a ninth embodiment of a housing cover in which the deformation limiting element comprises a plurality of fastening means through-opening portions that each extend along a circumferential direction of one of the fastening means through-openings over a circumferential angle around the respective fastening means through-opening, and the deformation limiting element further comprises a plurality of intermediate fastening means through-opening portions that each extend along a peripheral direction of a rim portion of the housing cover located between two of the fastening means through-openings and each comprise a bending region in which the material of the deformation limiting element is bent out of a reference plane extending in parallel to the seal support face by a bend angle of substantially 90° and ends at an end face with which the housing cover can be placed against the housing, with the viewing direction toward the seal support face of the housing cover;

The same or functionally equivalent elements are provided with the same reference numerals in all Figures.

DETAILED DESCRIPTION OF THE INVENTION

Figure 1:
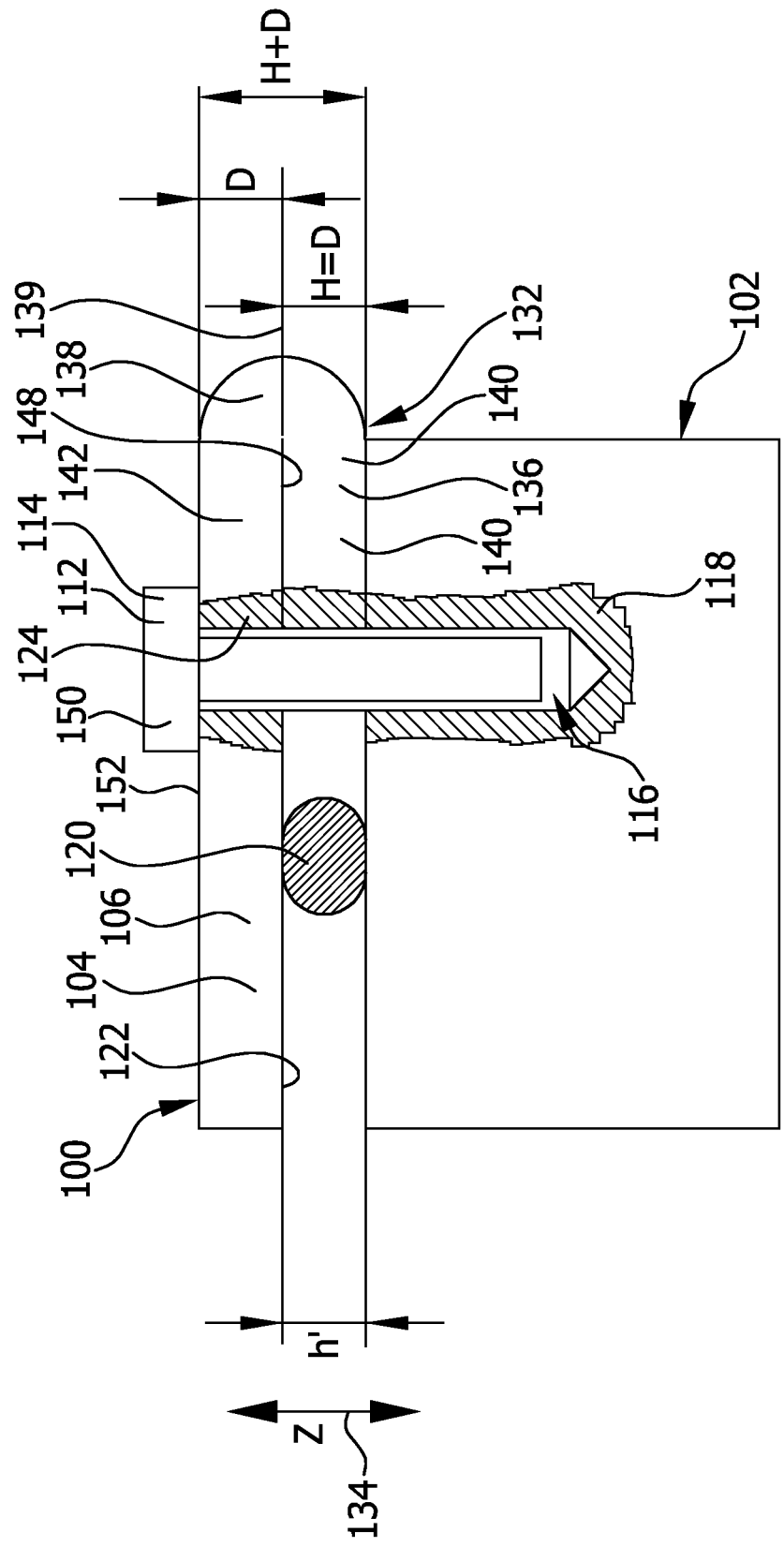
FIG. 1 shows a partially cut side view of a rim region of a housing cover, which is fixed by means of a fastening means that extends through a fastening means through-opening of the housing cover to a housing, wherein a sealing bead that comprises an elastomeric material is arranged on a seal support face of the housing cover and the housing cover comprises a deformation limiting element, which projects over the seal support face in the same direction as the sealing bead and limits a deformation of the sealing bead in the assembled state of the housing cover, wherein the deformation limiting element comprises a bending region in which the material of the deformation limiting element is bent out of a reference plane running substantially in parallel to the seal support face by a bend angle of about 180°, and a folding over region, which is connected by way of the bending region and an abutment region to a seal support region of the housing cover on which the sealing bead is arranged and abuts against the abutment region on the same side of the housing cover on which the sealing bead is arranged on the seal support region.
Figure 10:
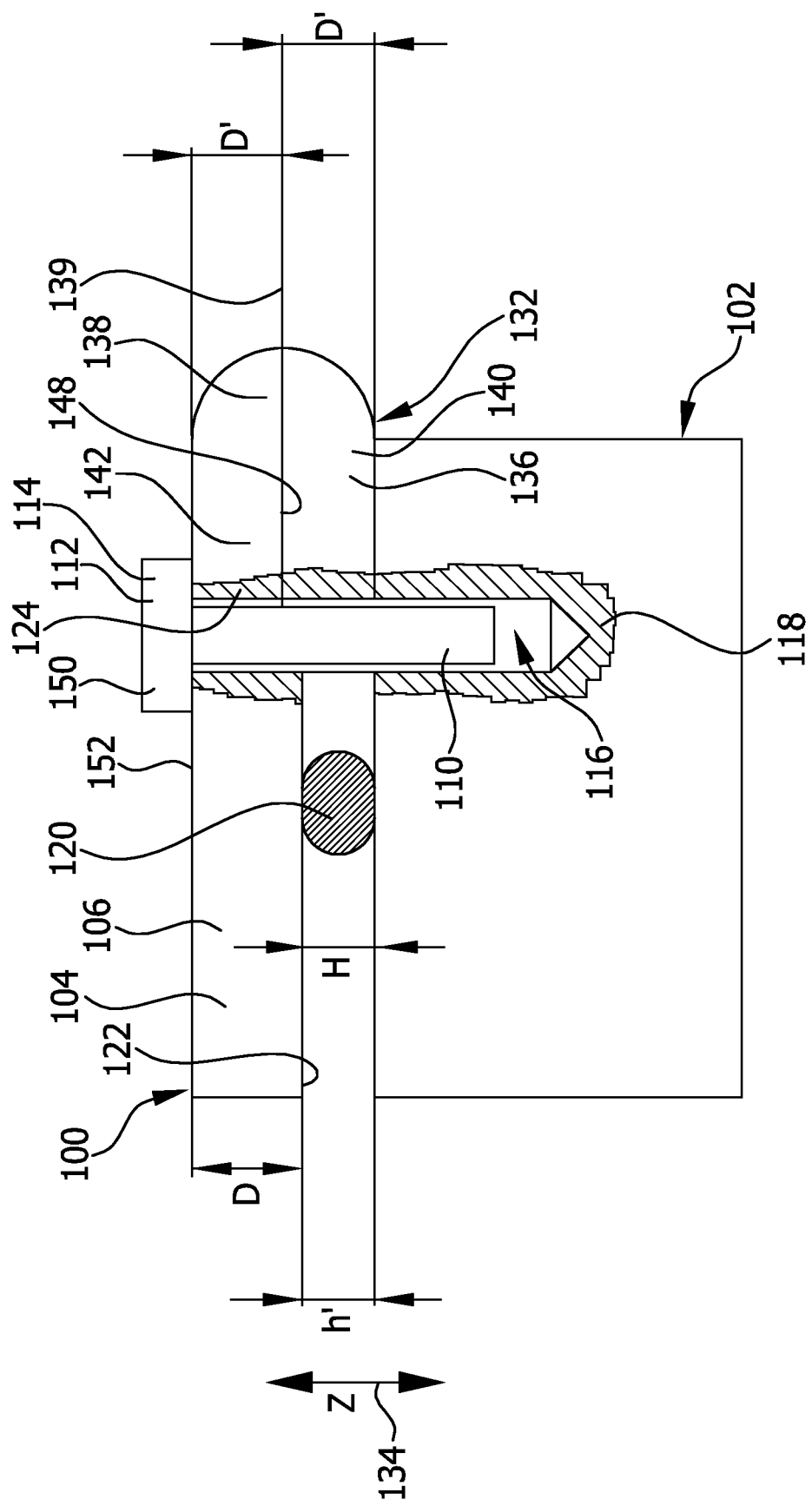
FIG. 10 shows a cut corresponding to FIG. 1 along line 10-10 in FIG. 11 through a rim region of a third embodiment of a housing cover in which the thickness of the folding over region is equal to the thickness of the abutment region and the thicknesses of the folding over region and the abutment region are smaller than the thickness of the seal support region.

A housing cover, depicted sectionally in FIGS. 1 and 2 and denoted as a whole with 100, is provided for closing a housing opening on a housing 102, for example on a housing of a control device or a power inverter, in particular of a power inverter of a drive device for an electric car.

The housing cover 100 depicted as an example in the drawings comprises a metallic base plate 104 with a preferably substantially planar seal support region 106.

Along the outer periphery of the seal support region 106 of the housing cover 100, the housing cover 100 is provided with a plurality of fastening means through-openings 108, which succeed one another along the periphery of the housing cover at 100 a distance from one another.

These fastening means through-openings 108 serve in the assembly of the housing cover 100 on the housing 102 to be closed to receive the shanks 110 of fastening means 112, preferably in the form of fastening screws 114 (cf. FIG. 1, which depicts the housing cover 100 in its state assembled on the housing 102 by means of the fastening means 112), which extend through the fastening means through-openings 108 and are screwed with their external threads into corresponding internal threads of threaded holes 116 in fastening means assembly regions 118 of the housing 102 to be closed.

One or more of the fastening means through-openings 108 are preferably arranged at least partially in a respective fastening means through-opening region 124 of the housing cover 100, which is arranged between two intermediate fastening means through-opening regions 126 of the housing cover 100 and which projects outwardly over an outer rim 128 of the adjoining intermediate fastening means through-opening regions 126. The outer rim 130 of the fastening means through-opening region 124 preferably runs substantially along the circumferential direction of the respective fastening means through-opening 108.

For achieving a fluid-tight seal between the housing cover 100 and the housing 102 to be closed, a sealing bead 120 is provided, which is arranged on an inside of the housing cover 100 that in the assembled state of the housing cover 100 faces toward the inside space of the housing 102 to be closed and that forms a seal support face 122 of the housing cover 100.

The sealing bead 120 runs along the rim of the housing cover 100 and is preferably of annularly closed configuration.

The sealing bead 120 is made of an elastomeric material, for example of a silicone material, and can be formed, for example, by application by means of a dispenser (in a so-called CIP ("cured in place") method) or by a screen printing method on the seal support face 122.

When assembling the housing cover 100 on the housing 102 by means of the fastening means 112, the sealing bead 120 is compressed by tightening the fastening means 112 in the threaded holes 116 of the fastening means assembly regions 118 of the housing 102, the height of the sealing bead 120, i.e., its extent perpendicular to the seal support face 122, being reduced from the height h in the unloaded state to a value h' in the assembled state.

The elastic restoring force of the elastomeric sealing bead 120 then produces the sealing force with which the sealing bead 120 sealingly abuts on the housing 102.

To avoid excessive deformation of the sealing bead 120, the housing cover 100 comprises one or more deformation limiting elements 132, which project over the seal support face 122 in the same direction, namely in a Z-direction 134 oriented perpendicular to the seal support face 122, as the sealing bead 120 and limit a deformation of the sealing bead 120 in the assembled state of the housing cover 100.

The deformation limiting element 132 is configured to be stiffer than the sealing bead 120, preferably substantially rigid, such that the height h' of the sealing bead 120 in the pressed state thereof is limited at the bottom by the height H of the deformation limiting element 132 over the seal support face 122.

At least one of the deformation limiting elements 132 comprises a fastening means through-opening portion 136, which extends along a circumferential direction of a respectively associated fastening means through-opening 108 over a circumferential angle $\beta$ around the respective fastening means through-opening 108.

The circumferential angle $\beta$ is preferably more than 90°, in particular more than 120°, particularly preferably more than 160°.

Furthermore, the circumferential angle $\beta$ is preferably less than 270°, in particular less than 200°.

As can best be seen in FIG. 1, the deformation limiting element 132 comprises a bending region 138 in which the material of the deformation limiting element 132 is bent out of a reference plane 139 extending in parallel to the seal support face 122 by a bend angle $\alpha$ of about 180°.

The deformation limiting element 132 further comprises a folding over region 140, which is connected, preferably in one piece, by way of the bending region 138 and an abutment region 142 of the housing cover 100 to the seal support region 106 of the housing cover 100 on which the sealing bead 120 is arranged.

The folding over region 140 abuts against the abutment region 142 on the same side of the housing cover 100 on which the sealing bead 120 is arranged on the housing cover 100.

The folding over region 140 preferably abuts in surface-to-surface contact, particularly in complete surface-to-surface contact, against the abutment region 142.

The housing cover 100 is made from a starting material, in particular from a metallic sheet metal material, which has a material thickness or thickness D that is preferably smaller than 1.5 mm.

The thickness D of the starting material of the housing cover 100 is, in particular, less than 1.4 mm, particularly preferably less than 1.2 mm, for example about 1.0 mm.

The housing cover 100 including the deformation limiting element 132 is produced from this starting material as follows:

A housing cover preform 144 depicted sectionally in FIG. 3 is separated out from the metallic starting material.

The separating out may take place, e.g., by cutting out, for example by means of a laser, or by punching out.

The housing cover preform 144 comprises a tab 146, which comprises the folding over region 140 and part of the subsequent bending region 138 of the deformation limiting element 132 (shown in FIG. 3 by hatching).

By performing a bending operation, the folding over region 140 and part of the bending region 138 is moved up out of the plane of the starting material, and subsequently the folding over region 140 is folded over onto the abutment face 148 of the abutment region 142 that faces toward said folding over region 140.

The folding over region 140 folded over onto the abutment region 142 is pressed together with the abutment region 142.

In the finished state of the housing cover 100, the folding over region 140 abuts in substantially surface-to-surface contact against the abutment face 148 of the abutment region 142, and the bend angle $\alpha$ of the bending region 138 is substantially 180°.

In principle, provision could be made that the folding over region 140 completely surrounds the fastening means through-opening 108.

In the graphically depicted embodiment, however, provision is made that the folding over region 140 does not completely surround the fastening means through-opening 108, but rather bounds same only over a circumferential angle $\beta$ of less than 360°, preferably less than 270°, each in relation to the longitudinal central axis of the fastening means through-opening 108.

It is hereby achieved that no portion of the folding over region 140 is arranged between the fastening means through-opening 108 on the one hand and the sealing bead 120 on the other hand, such that the sealing bead 120 can be guided very closely past the fastening means through-opening 108 so that a highest possible pressing force can be transmitted from the head 150 of the fastening means 112 via the seal support region 106 of the housing cover 100 to the sealing bead 120.

The head 150 of the fastening means 112 abuts preferably in substantially complete surface-to-surface contact against a fastening means abutment face 150 of the housing cover 102 that faces away from the seal support face 112, said fastening means abutment face 152 preferably being of substantially planar configuration.

As can best be seen in FIG. 1, in this embodiment of the housing cover 100, the folding over region 140, the abutment region 142, and the seal support region 106 of the housing cover 100 each have the thickness D, which corresponds to the thickness or material thickness of the metallic starting material.

In this embodiment, the height H of the deformation limiting element 132 over the seal support face 122 is equal to the thickness D of the starting material and thus equal to the thickness of the abutment region 142 and the thickness of the seal support region 106 of the housing cover 100.

As a result of the deformation limiting element 132, also referred to as a stopper, in the assembly of the housing cover 100 on the housing 102, the sealing bead 120 is compressed to a defined measure h', which corresponds to the height H of the deformation limiting element 132 over the seal support face 122.

An over-compression of the sealing bead 120 is thereby prevented.

The metallic starting material from which the housing cover 100 is made may comprise, in particular, aluminum or an aluminum alloy.

Alternatively hereto, provision may also be made that the starting material from which the housing cover 100 is made is a stainless steel material.

In principle, any other sheet-shaped, in particular metallic, starting material comes into consideration for the production of the housing cover 100.

A second embodiment of a housing cover 100 depicted in FIGS. 4 to 9 differs from the embodiment that is described above and is depicted in FIGS. 1 to 3 in that the thickness D' of the folding over region 140 of the deformation limiting element 132 and thus the height H of the deformation limiting element 132 over seal support face 122 is smaller than the thickness D of the abutment region 142 and the seal support region 106, which match the thickness D of the starting material.

This is achieved by a region of the starting material in FIG. 6 located within the frame 154 depicted there being graded before the housing cover preform 144 is separated out of the starting material.

The thickness of the folding over region 104 is hereby reduced by grading the starting material from the initial value D to the value D', which is preferably at most 0.9 D, in particular at most 0.8 D, particularly preferably at most 0.7 D.

The grading operation hereby takes place from the sheet inside in the direction to the sheet outside of the starting material provided in sheet form, such that no height difference or edge has to be overcome in the subsequent bending operation.

A space-saving deformation limiting element 132 can thus be produced with a height H that is smaller than the thickness D of the starting material, without intervening into the material structure of the material of the housing cover 100, because the sheet metal fold is moved from outside to inside.

In this embodiment, the degree of reshaping in the folding over region 140 is relatively high, though.

In the production of the second embodiment of the housing cover, one proceeds as follows:

First the starting material is graded in the region marked by the frame 154 in FIG. 6 in order to reduce the material thickness in the folding over region 140. After the grading operation, the housing cover preform 144 is separated out of the starting material (cf. FIG. 7).

For example, during the grading operation, the thickness of the starting material in the folding over region 140 may be reduced from 1.5 mm to 1.0 mm.

In a subsequent bending operation, a portion of the material of the bending region 138 and the folding over region 140 are bent out of the reference plane 139 extending in parallel to the seal support face 122 (cf. FIG. 8, with the bend angle α that increases over the course of the bending operation from 0° to) 180°.

After the bending operation is completed and the folding over region 140 abuts in surface-to-surface contact, preferably substantially complete surface-to-surface contact, against the abutment face 148 of the abutment region 142, the folded over region 140 and the abutment region 142 are pressed together (cf. FIG. 9).

The production of the deformation limiting element 132 is thus complete.

The sealing bead 120 is not produced on the seal support region 106 of the housing cover 102.

In all other respects, the second embodiment of a housing cover 100 depicted in FIGS. 4 to 9 corresponds with respect to structure, function, and production method with the first embodiment depicted in FIGS. 1 to 3, to the preceding description of which reference is made in this regard.

A third embodiment of a housing cover 100 depicted in FIGS. 10 to 15 differs from the first embodiment depicted in FIGS. 1 to 3 in that the thickness D' of the folding over region 140 and the thickness D' of the abutment region 142 of the deformation limiting element 132 are both smaller than the thickness D of the seal support region 106, which corresponds to the thickness D of the starting material of the housing cover 100.

In this embodiment, the thicknesses D' of the folding over region 140 and D' of the abutment region 142 are substantially equal.

Figure 12:
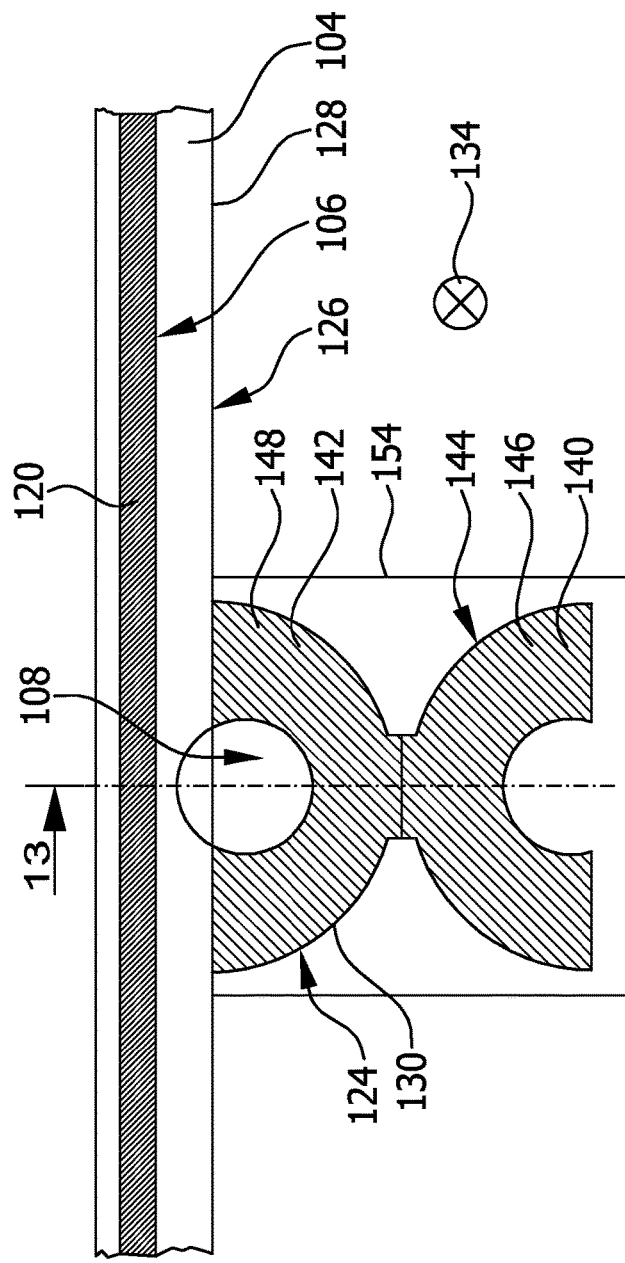
FIG. 12 shows a plan view of a housing cover preform of the third embodiment of a housing cover from FIGS. 10 and 11 with the viewing direction toward the seal support face.
Figure 11:
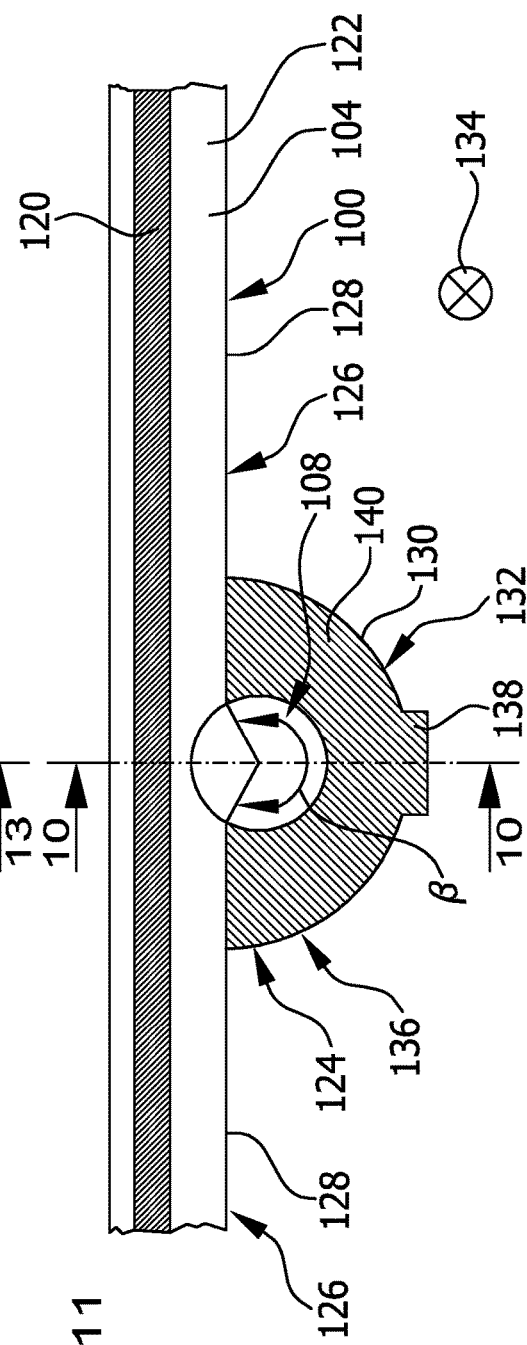
FIG. 11 shows a plan view of the rim region of the housing cover from FIG. 10, with the viewing direction toward the seal support face.

In this embodiment, this is achieved by the thickness D of the starting material within the region defined by the frame 154 in FIG. 12, said region comprising the folding over region 140, the bending region 138, and the abutment region 142 of the deformation limiting element 132, being reduced by grading.

The grading takes place within this region preferably with a constant degree of reshaping.

The reduced thickness D' of the region of the starting material reduced in thickness by grading is preferably at most 0.9 D and/or preferably at least 0.8 D, wherein D is the unreduced thickness of the starting material.

By reducing the thickness D' of the abutment region 142 compared to the thickness D of the seal support region 106, in this embodiment of the housing cover 100, the height H of the deformation limiting element 132 and thus the height h' to which the sealing bead 120 is compressed in the assembly of the housing cover 100 on the housing 102 is smaller than the material thickness D of the starting material and smaller than the thickness D' of the folding over region 140.

If, for example, a starting material with the thickness D=1.5 mm in the folding over region 104 and in the abutment region 142 is graded to, e.g., 1.25 mm, this results in a height H of the deformation limiting element 132 over the seal support face 122 of 1.0 mm.

In the production of the third embodiment of the housing cover, one proceeds as follows:

The starting material with the material thickness D is reduced in the region marked by the frame 154 in FIG. 12 by a grading operation to the smaller thickness D'. After the grading operation, the housing cover preform 144 is separated out of the starting material (cf. FIG. 13).

Part of the bending region 138 and the folding over region 140 are bent out of the reference plane 139 extending in parallel to the seal support face 122 and moved up (cf. FIG. 14, with the bend angle α increasing during the bending operation from 0° to 180°).

After a bend angle α of 180° is achieved and the folding over region 140 abuts substantially in surface-to-surface contact against the abutment face 148 of the abutment region 142, the folding over region 140 and the abutment region 142 are pressed together (cf. FIG. 15).

In all other respects, the third embodiment of a housing cover 100 depicted in FIGS. 10 to 15 corresponds with respect to structure, function, and production method with the second embodiment depicted in FIGS. 4 to 9, to the preceding description of which reference is made in this regard.

A fourth embodiment of a housing cover 100 depicted in FIGS. 16 to 19 differs from the third embodiment that is described above and depicted in FIGS. 10 to 15 in that the thickness $D_A$ of the abutment region 142 in the abutment region 142 is not constant, but rather varies with increasing distance from the bending region 138.

In particular, provision is made that the thickness $D_A$ of the abutment region 142 increases with increasing distance from the bending region 138 up to the value D, which corresponds to the thickness of the starting material and the thickness of the seal support region 106 of the housing cover 100.

Furthermore, in this embodiment, provision is made that the thickness $D_U$ of the folding over region 140 in the folding over region 104 is not constant, but rather varies with increasing distance from the bending region 138.

In particular, provision is made that the thickness $D_U$ of the folding over region 140 decreases with increasing distance from the bending region 138.

Figure 16:
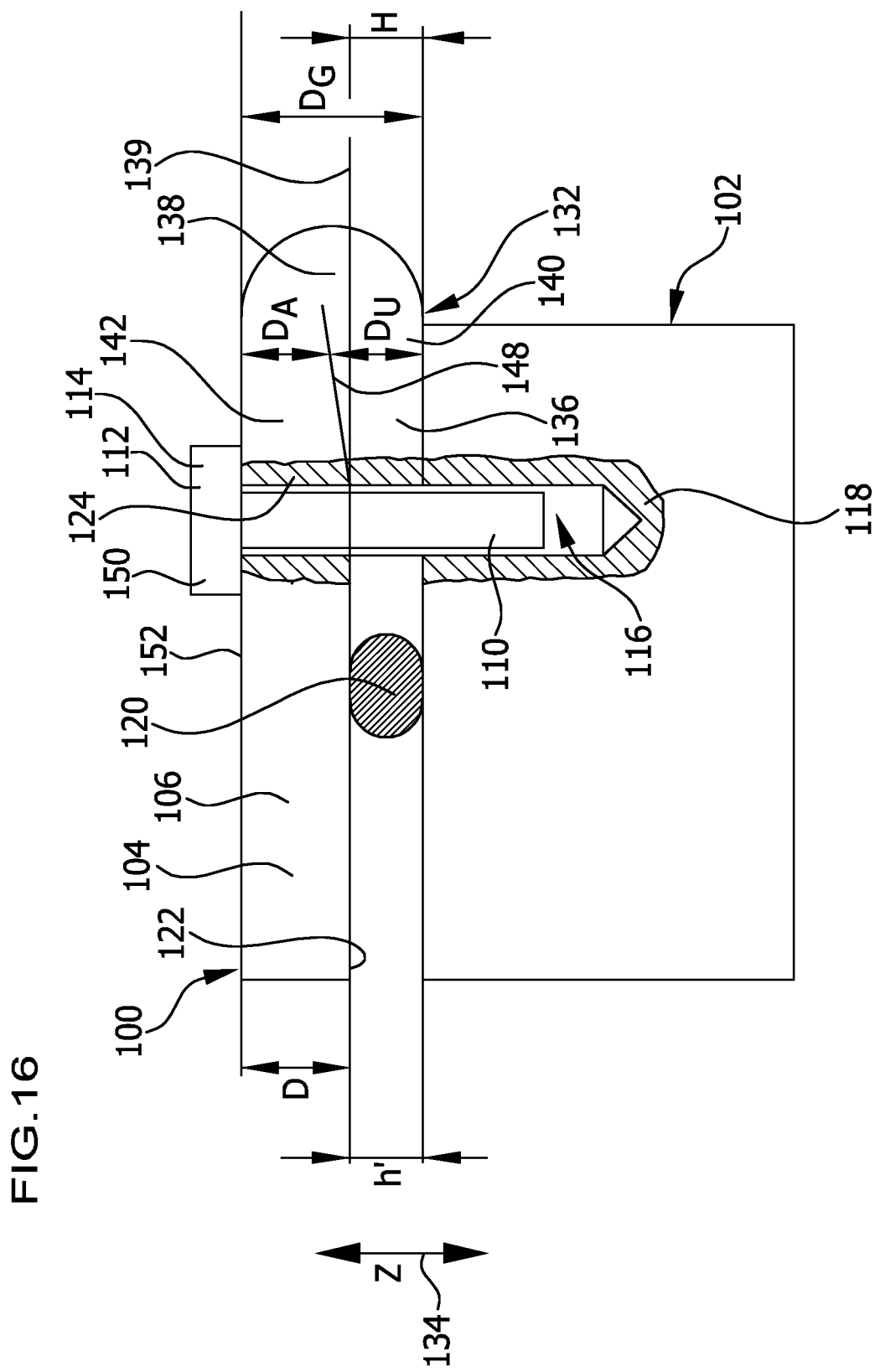
FIG. 16 shows a cut corresponding to FIG. 1 through a rim region of a fourth embodiment of a housing cover in which the thickness of the folding over region decreases with increasing distance from the bending region and the thickness of the abutment region increases with increasing distance from the bending region, such that the sum of the local thickness of the folding over region and the local thickness of the abutment region is substantially constant, independently of the distance from the bending region.
Figure 17:
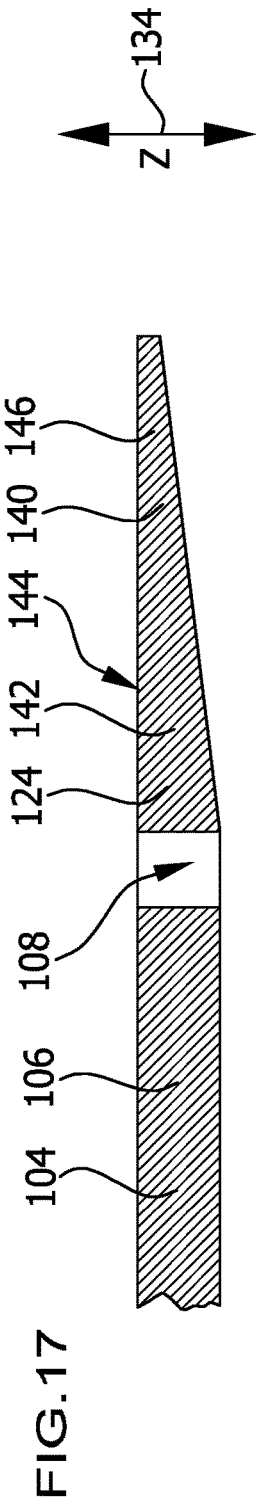
FIG. 17 shows a cut through a rim region of a housing cover preform of the fourth embodiment of a housing cover from FIG. 16 in which the thickness of the abutment region and the thickness of the folding over region decreases, preferably substantially continuously, in particular linearly, with increasing distance from the seal support region.

As can best be seen in FIG. 16, the sum $D_G$ of the local thickness $D_U$ of the folding over region 140 and the local thickness $D_A$ of the abutment region 142 is hereby preferably substantially independent of the distance from the bending region 138.

In this embodiment, the height H of the deformation limiting element 132 over the seal support face 122 corresponds to the difference of the total thickness $D_G$ of the folding over region 140 and the abutment region 142 on the one hand and the thickness D of the seal support region 106, which corresponds to the thickness D of the starting material, on the other hand.

This is achieved by the reshaping during the grading of the starting material being distributed over the abutment region 142, the subsequent bending region 138, and the folding over region 140 such that the degree of reshaping increases, preferably substantially continuously, particularly preferably linearly, from the rim of the abutment region 142 pointing toward the seal support region 106 up to the outer rim of the folding over region 140 pointing away from the bending region 138.

This can be effected, for example, by using a wedge-shaped grading tool, which limits the material displacement in the abutment region 142 to a minimum and shifts the high degree of reshaping to the folding over region 140.

This offers the advantage that excess starting material is pushed only to a limited extent in the direction toward the sealing bead 120 and/or in the direction toward the fastening means through-opening 108.

The desired outer contour of the folding over region 140 is maintained despite the high material displacement during the grading operation by the housing cover preform 144 being separated out of the starting material after the grading operation.

In the production of the fourth embodiment of the housing cover, one proceeds as follows:

In the starting material with the thickness D, the abutment region 142, the subsequent bending region 138, and the folding over region 140 are graded in the shape of a wedge, namely from the rim of the abutment region 142 pointing toward the seal support region 106 up to the rim of the folding over region pointing away from the seal support region 106, i.e., from inside to outside. After the grading operation, the housing cover preform 144 is separated out of the starting material (cf. FIG. 17).

Figure 18:
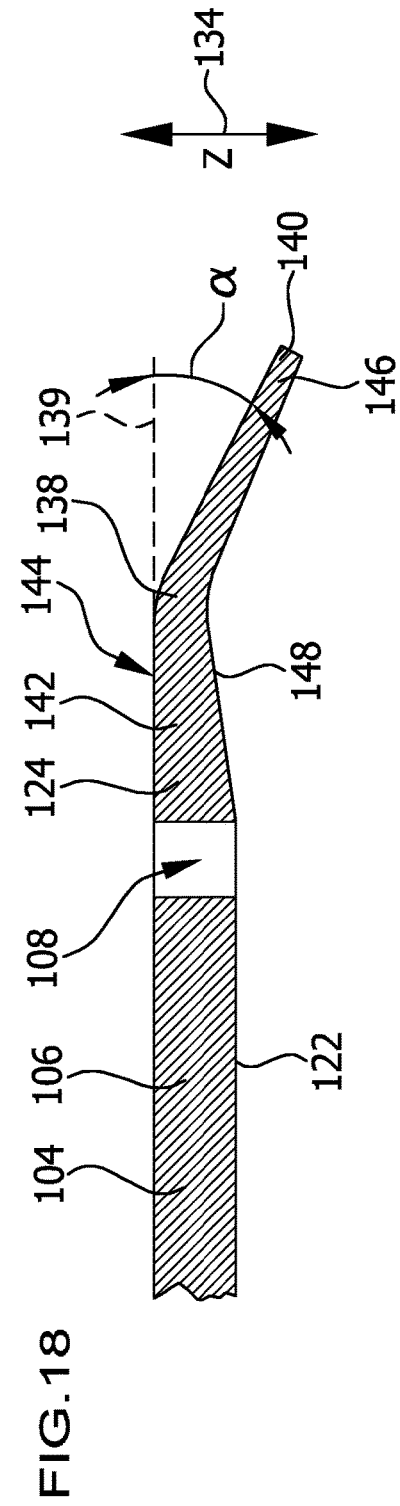
FIG. 18 shows a cut corresponding to FIG. 17 through the rim region of the housing cover preform from FIG. 17 after the beginning of a bending operation to produce the bending region, material of the deformation limiting element in the bending region having been bent out of a reference plane extending in parallel to the seal support face by an acute angle α.

In a bending operation, the folding over region and part of the bending region 138 are bent out of the reference plane 139 extending in parallel to the seal support face 122 (cf. FIG. 18, with the bend angle α that increases over the course of the bending operation from 0° to 180°).

Figure 19:
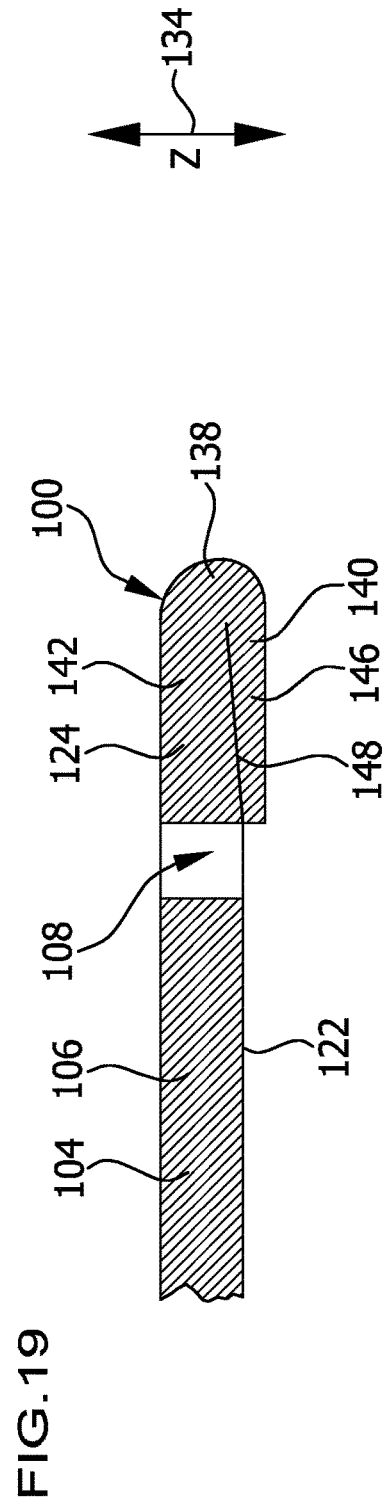
FIG. 19 shows a cut corresponding to FIGS. 17 and 18 through a rim portion of the fourth embodiment of a housing cover after the bending operation to produce the bend region is completed, material of the deformation limiting element has been bent out of the reference plane extending in parallel to the seal support face by a bend angle of 180°, and the folding over region abuts in surface-to-surface contact against the abutment region of the housing cover.

When the bending operation is completed and the folding over region 140 abuts in surface-to-surface contact, preferably substantially complete surface-to-surface contact, against the abutment face 148 of the abutment region 142, the folding over region 140 and the abutment region 142 are pressed together (cf. FIG. 19).

In all other respects, the fourth embodiment of a housing cover 100 depicted in FIGS. 16 to 19 corresponds with respect to structure, function, and production method with the third embodiment depicted in FIGS. 10 to 15, to the preceding description of which reference is made in this regard.

A fifth embodiment of a housing cover 100 depicted in FIGS. 20 and 21 differs from the four embodiments that are described above and depicted in FIGS. 1 to 19 in that the fastening means through-opening portion 136 of the deformation limiting element 132 in its folding over region 140 is composed of a plurality of segments 156, which form a contiguous folding over region 140 of the deformation limiting element 132 as a result of the pressing and the resulting merging of the material of the segments 156.

In the housing cover preform 144 depicted in FIG. 21, the segment preforms 158 from which the segments 156 of the folding over region 140 are subsequently formed succeed one another along the circumferential direction of the fastening means through-opening 108, a respective gap 160 being arranged between two respective segment preforms 158 succeeding one another in the circumferential direction.

The number of segment preforms 158 and thus the number of segments 156 is preferably two or more, in particular three or more, particularly preferably four or more, for example five or more.

In the depicted embodiment, five segment preforms 158 and thus also five segments 156 in the completed folding over region 140 are present.

The segment preforms 158 preferably protrude outwardly from the abutment region 142 of the housing cover 100 in substantially radial direction of the associated fastening means through-opening 108.

In the production of the fifth embodiment of the housing cover 100, one proceeds as follows:

If the height H of the deformation limiting element 132 over the seal support face 122 is to be smaller than the thickness D of the starting material, the abutment region 142, the subsequent bending region 138, and the segment preforms 158 of the folding over region 140 are graded as described above in the context of the second, third, or fourth embodiment of the housing cover 100.

The housing cover preform 144 depicted in FIG. 21 is separated out of the starting material.

The segment preforms 158 are bent out of the reference plane 139 extending in parallel to the seal support face 122, are moved up, and are folded over onto the abutment face 148 of the abutment region 142 until the segment preforms 158 abut in surface-to-surface contact, preferably substantially complete surface-to-surface contact, against the abutment face 148 of the abutment region 142.

Then the abutment region 142 and the segment preforms 158 of the folding over region 140 are pressed together and preferably graded in order to, as the case may be, produce a deformation limiting element 132 with a height H that is reduced in comparison to the material thickness D of the starting material.

As a result of the pressing operation and the optional grading operation, the segments 156 of the folding over region 140 merge with one another and form a one-piece folding over region 140, which has a height that is substantially constant along the circumferential direction of the fastening means through-opening 108.

This height of the folding over region 140 may be, e.g., 1.0 mm in the case of a material thickness of the starting material of, e.g., 1.5 mm.

In all other respects, the fifth embodiment of a housing cover 100 depicted in FIGS. 20 to 21 corresponds with respect to structure, function, and production method with the first embodiment depicted in FIGS. 1 to 3, to the preceding description of which reference is made in this regard.

A sixth embodiment of a housing cover 100 depicted in FIGS. 22 and 23 differs from the fifth embodiment that is described above and depicted in FIGS. 20 and 21 in that the folding over region 140 of the fastening means through-opening portion 136 of the deformation limiting element 132, instead of five approximately circular sector-shaped segments 156, comprises only two, for example wing-shaped, segments 156.

As can be seen in FIG. 22, the segments 156 of the folding over region 140 contact one another on their end faces 161.

Both segments 156 adjoin the abutment region 142 of the housing cover 100 on diametrically opposed rim portions 162 in relation to the longitudinal central axis 163 of the fastening means through-opening 108.

In all other respects, the sixth embodiment of a housing cover 100 depicted in FIGS. 22 to 23 corresponds with respect to structure, function, and production method with the fifth embodiment depicted in FIGS. 20 to 21, to the preceding description of which reference is made in this regard.

A seventh embodiment of a housing cover 100 depicted in FIGS. 24 and 25 differs from the first embodiment depicted in FIGS. 1 to 3 in that the deformation limiting element 132 of the housing cover 100 comprises not only fastening means through-opening portions 136, which each extend along a circumferential direction of one of the fastening means through-openings 108, but also one or more intermediate fastening means through-opening portions 164, which each extend along a peripheral direction of a rim portion 166 of the housing cover 100 located between two of the fastening means through-openings 108.

In these intermediate fastening means through-opening portions 164, too, the deformation limiting element 132 comprises in each case an abutment region 142, a bending region 138, and a folding over region 140 that abuts in surface-to-surface contact, preferably substantially complete surface-to-surface contact, against the abutment face 148 of the abutment region 142 and is preferably pressed together with the abutment region 142.

Such an intermediate fastening means through-opening portion 164 of the deformation limiting element 132 serves not only to limit the deformation of the sealing bead 120 during the assembly of the housing cover 100 on the housing 102, but can also serve to protect the sealing bead 120 against outside influences, for example against the ingress of contamination or aggressive media or pressurized media, for example the fluid of a high-pressure water jet, because the folding over region 140 of such an intermediate fastening means through-opening portion 164 abuts in surface-to-surface contact, preferably substantially complete surface-to-surface contact, against the housing 102 and thus prevents a gap from forming between the housing cover 100 and the housing 102, through which such contamination or aggressive and/or highly pressurized media could reach the sealing bead 120.

In addition, the folding over region 104 of such an intermediate fastening means through-opening portion 164 of a deformation limiting element 132 can ensure an electrically conductive contact between the housing cover 100 and the housing 102, such that the unit of housing cover 100 and housing 102 has EMC protection, which prevents influence of electric, magnetic, or electromagnetic fields from the outside space of the housing 102 on electrical devices in the inside space of the housing 102.

In all other respects, the seventh embodiment of a housing cover 100 depicted in FIGS. 24 to 25 corresponds with respect to structure, function, and production method with the first embodiment depicted in FIGS. 1 to 3, to the preceding description of which reference is made in this regard.

In the seventh embodiment of a housing cover, too, the abutment region 142 and/or the folding over region 140 may be graded in each of the intermediate fastening means through-opening portions 164 and/or in each of the fastening means through-opening portions 136 of the deformation limiting element 132 in the same manner as has been described above in the context of the second embodiment, the third embodiment, or the fourth embodiment of a housing cover 100.

An eighth embodiment of a housing cover 100 depicted in FIGS. 26 and 27 differs from the seventh embodiment that is described above and depicted in FIGS. 24 and 25 in that the folding over region 140 of an intermediate fastening means through-opening portion 164 of the deformation limiting element 132 is not of one-part configuration, but rather is composed of a plurality of segments 168, which succeed one another in the peripheral direction of the rim portion 166 of the housing cover 100 and have preferably merged together as a result of being pressed together with the abutment region 142.

In the housing cover preform 144 of this embodiment of the housing cover 100 depicted in FIG. 27, a respective gap 172 is arranged between two respective segment preforms 170 succeeding one another in the peripheral direction of the rim portion 166 of the housing cover 100.

The segment preforms 170 and thus the resulting segments 168 may all have the same length or differ from one another with respect to their length, taken along the peripheral direction of the rim portion 166 of the housing cover 100.

In all other respects, the eighth embodiment of a housing cover 100 depicted in FIGS. 26 to 27 corresponds with respect to structure, function, and production method with the seventh embodiment depicted in FIGS. 24 to 25, to the preceding description of which reference is made in this regard.

In particular, in the eighth embodiment, too, the segments 156 and/or the abutment region 142 may be reduced in their height in comparison to the height D of the starting material by means of a grading operation.

Figure 29:
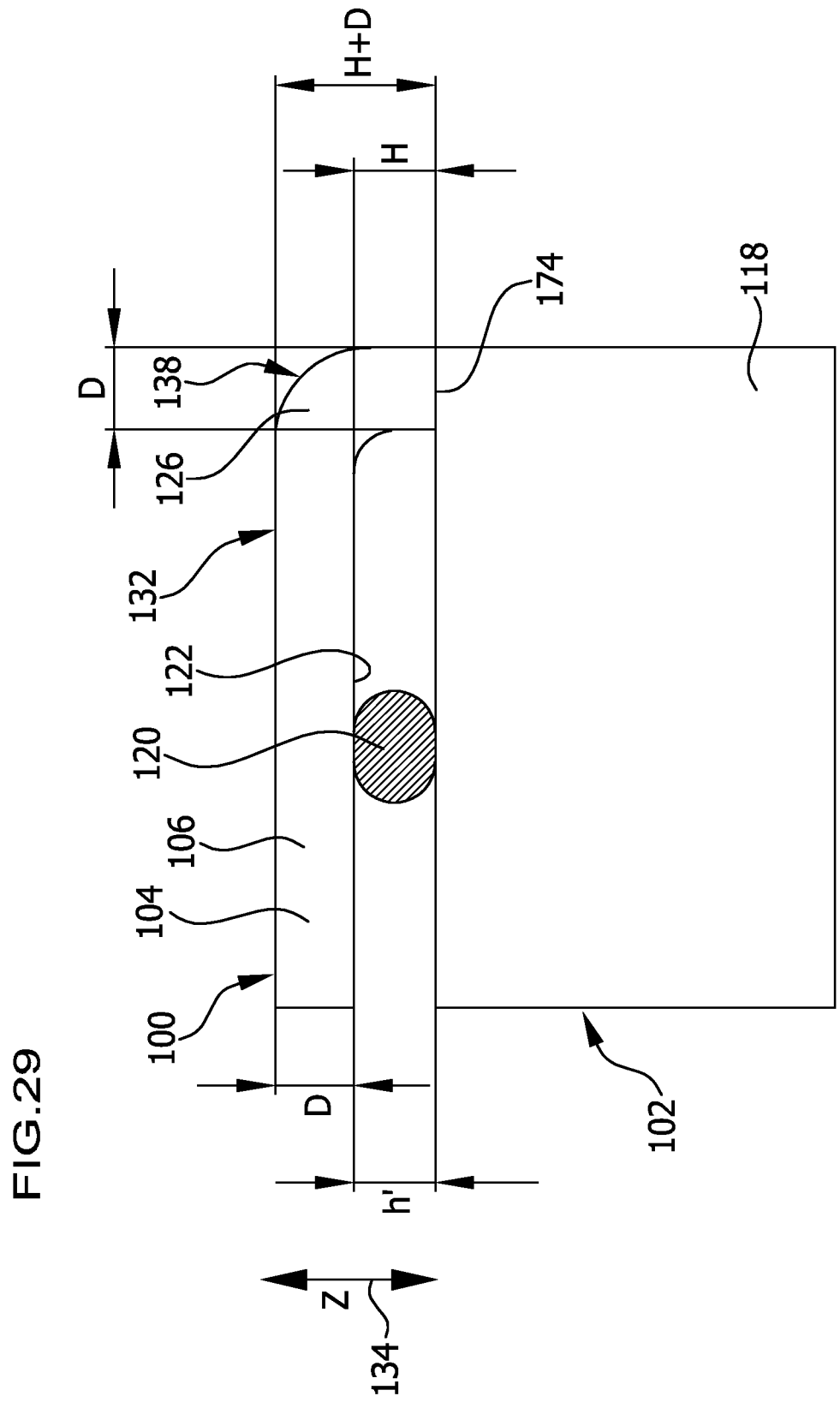
FIG. 29 shows a cut through the rim region of the housing cover from FIG. 28, along line 29-29 in FIG. 28.

A ninth embodiment of a housing cover 100 depicted in FIGS. 28 and 29 differs from the seventh embodiment depicted in FIGS. 24 and 25 in that in the intermediate fastening means through-opening portion 164 of the deformation limiting element 132, the bending region 138 is not bent out of the reference plane 139 extending in parallel to the seal support face 122 by a bend angle α of 180°, but instead the bend angle α is substantially 90° and the bending region 138 ends on an end face 174 with which the housing cover 100 abuts against the housing 102 in the assembled state on the housing 102 (cf. FIG. 29).

In this case, the folding over region 104 of the deformation limiting element 132 is thus no longer necessary.

The portion of the bending region 138 that is bent out of the reference plane 139 by 90° and projects over the seal support face 122 of the housing cover 100 by the height H, in this embodiment of the housing cover 100, limits the deformation of the sealing bead 120 during the assembly of the housing cover 100 on the housing 102.

In a direction running in parallel to the seal support face 122 and perpendicularly to the outer rim of the housing cover 100, this embodiment of a deformation limiting element 132 has only a very small extent, which corresponds substantially to the thickness D of the starting material of the housing cover 100 or is only slightly greater than the thickness D. In particular, provision may be made that the extent of the deformation limiting element 132 in parallel to the seal support face 122 and perpendicular to the rim of the housing cover 100 is less than twice the thickness D of the starting material of the housing cover 100 or the thickness D of the seal support region 106 of the housing cover 100.

This saves a large amount of space in the already very narrow intermediate fastening means through-opening region 126 of the housing cover 100 by the bending region 138 of the deformation limiting element 132 not being bent by a bend angle α of 180°, but instead only by a bend angle α of 90° and being positioned perpendicular to the seal support face 122.

In all other respects, the ninth embodiment of a housing cover 100 depicted in FIGS. 28 to 29 corresponds with respect to structure, function, and production method with the seventh embodiment of the housing cover 100 depicted in FIGS. 24 to 25, to the preceding description of which reference is made in this regard.

Figure 30:
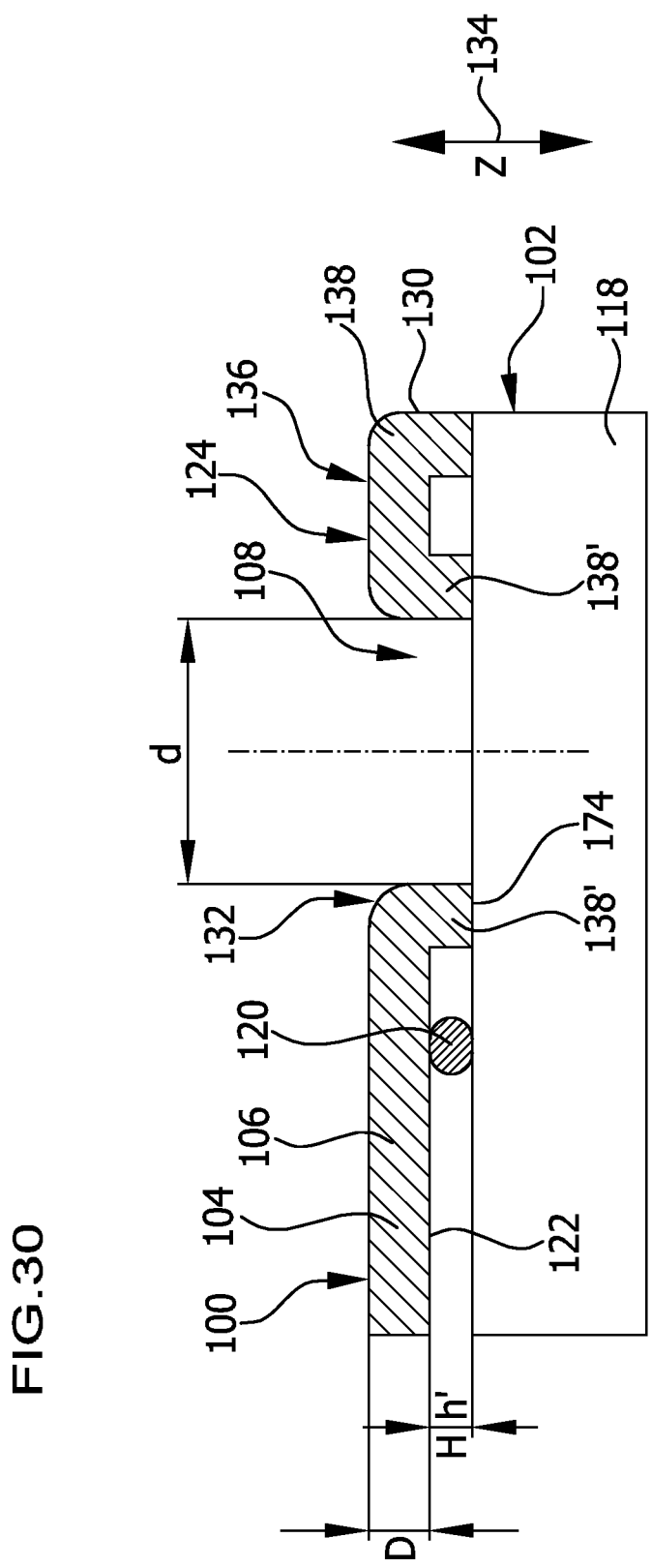
FIG. 30 shows a cut through a rim region of a tenth embodiment of a housing cover in which the deformation limiting element comprises bending regions running on an outer rim of the housing cover, said bending regions having a bend angle of substantially 90°, and bending regions running on the rims of the fastening means through-openings of the housing cover, said bending regions having a bend angle of substantially 90°.

A tenth embodiment of a housing cover 100 depicted in FIG. 30 differs from the ninth embodiment depicted in FIGS. 28 and 29 in that the deformation limiting element 132 is formed not only in the intermediate fastening means through-opening portion 164, but additionally or alternatively also in the fastening means through-opening portion 136 of the deformation limiting element 132 by a bending region 138 with a bend angle of substantially 90°. In particular, in this embodiment, the deformation limiting element 132 may have an additional bending region 138', which bounds the fastening means through-opening 108 (with the diameter d; cf. FIG. 30) and abuts with its end face 174 against the housing 102 in the assembled state of the housing cover 100 on the housing 102.

This bending region 138', too, has a bend angle of substantially 90°.

This bending region 138' is also not adjoined by a folding over region 140 folded over onto an abutment region 142 of the housing cover 100.

In all other respects, the tenth embodiment of a housing cover 100 depicted in FIG. 30 corresponds with respect to structure, function, and production method with the ninth embodiment depicted in FIGS. 28 to 29, to the preceding description of which reference is made in this regard.

Figure 31:
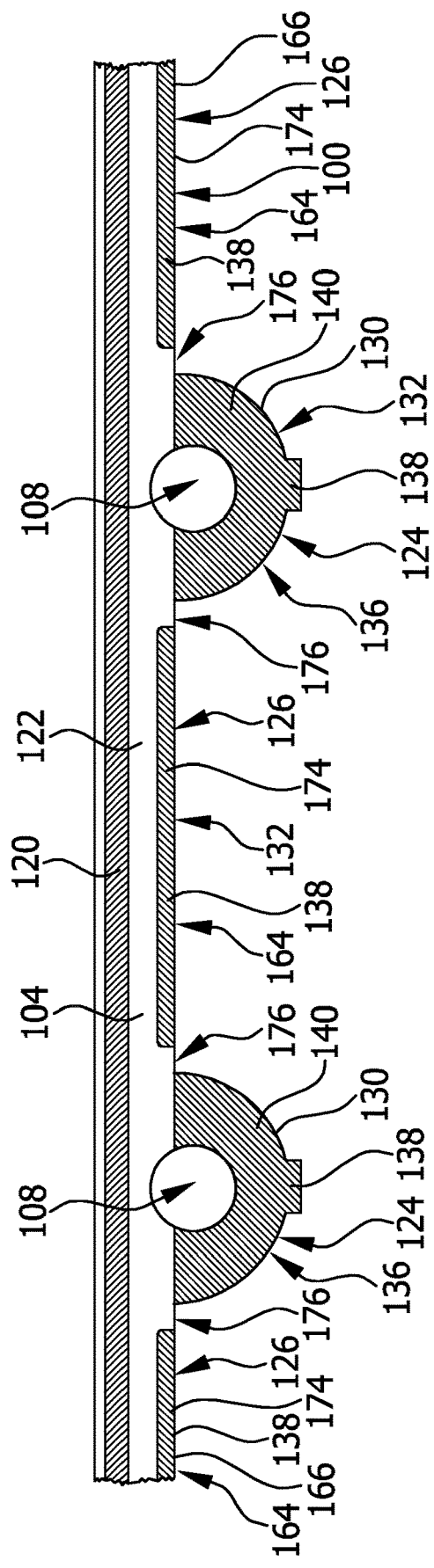
FIG. 31 shows a plan view corresponding to FIG. 28 of a rim portion of an eleventh embodiment of a housing cover in which the deformation limiting element comprises a plurality of fastening means through-opening portions that each extend along a circumferential direction of one of the fastening means through-openings over a circumferential angle around the respective fastening means through-opening, and the deformation limiting element further comprises a plurality of intermediate fastening means through-opening portions that each extend along a peripheral direction of a rim portion of the housing cover located between two of the fastening means through-openings and each comprise a bending region in which the material of the deformation limiting element is bent out of a reference plane extending in parallel to the seal support face by a bend angle of substantially 90° and ends at an end face with which the housing cover can be placed against the housing, with the viewing direction toward the seal support face of the housing cover, a respective outlet opening being formed between a respective intermediate fastening means through-opening portion of the deformation limiting element and an adjacent fastening means through-opening portion of the deformation limiting element, through which outlet opening moisture or liquid can discharge from the intermediate region between the sealing bead and the intermediate fastening means through-opening portion of the deformation limiting element into the outside space of the housing cover.

An eleventh embodiment of a housing cover 100 depicted in FIG. 31 differs from the ninth embodiment depicted in FIGS. 28 and 29 in that the housing cover 100 comprises one or more outlet openings 176, which are each arranged between a respective end region of an intermediate fastening means through-opening portion 164 of the deformation limiting element 132 and a respective fastening means through-opening portion 136 of the deformation limiting element 132.

These outlet openings 176 each produce a fluidic connection from the intermediate region between the sealing bead 120 and the intermediate fastening means through-opening portion 164 of the deformation limiting element 132 into the outside space of the housing cover 100, via which liquid or moisture that arises and/or collects in this intermediate region can discharge into the outside space of the housing cover 100, thereby preventing corrosive damage to the housing cover in this intermediate region.

In this embodiment, each of the outlet openings 176 thus has the form of a gap or a space between an end region of an intermediate fastening means through-opening portion 164 of the deformation limiting element 132 and a fastening means through-opening portion 136 of the deformation limiting element 132.

In all other respects, the eleventh embodiment of a housing cover 100 depicted in FIG. 31 corresponds with respect to structure, function, and production method with the ninth embodiment depicted in FIGS. 28 to 29, to the preceding description of which reference is made in this regard.

In alternative configurations of the eleventh embodiment of a housing cover 100, provision may be made that the intermediate fastening means through-opening portions 164 of the deformation limiting element 132 are configured as in the seventh embodiment of a housing cover 100 depicted in FIGS. 24 and 25.

In this case, in the intermediate fastening means through-opening portions 164, the deformation limiting element thus comprises in each case an abutment region 142, a bending region 138, and a folding over region 140 that abuts in surface-to-surface contact, preferably substantially complete surface-to-surface contact, against the abutment face 148 of the abutment region 142 and is preferably pressed together with the abutment region 142.

In a further alternative configuration of the eleventh embodiment of a housing cover 100, the intermediate fastening means through-opening portions 164 of the deformation limiting element 132 may be configured as in the eighth embodiment of a housing cover 100 depicted in FIGS. 26 and 27.

In this case, the folding over region 140 of an intermediate fastening means through-opening portion 164 of the deformation limiting element 132 is not of one-part configuration, but instead is composed of a plurality of segments 168, which succeed one another in the peripheral direction of the rim portion 166 of the housing cover 100 and have preferably merged together by being pressed together with the abutment region 142.

The invention claimed is:

1. A housing cover for fixing to a housing,
    wherein the housing cover is provided with a plurality of fastening means through-openings and with a sealing bead that comprises an elastomeric material and
    wherein the sealing bead is arranged on a seal support face of the housing cover,
    wherein the housing cover comprises at least one deformation limiting element, which projects over the seal support face in the same direction as the sealing bead and limits a deformation of the sealing bead in an assembled state of the housing cover,
    wherein the deformation limiting element comprises a bending region in which a material of the deformation limiting element is bent out of a reference plane extending substantially in parallel to the seal support face by a bend angle of at least 30°,
    wherein the deformation limiting element comprises a folding over region, which is connected by way of the bending region and an abutment region to a seal support region of the housing cover on which the sealing bead is arranged, wherein the folding over region abuts against the abutment region on the same side of the housing cover on which the sealing bead is arranged on the seal support region, and wherein an average thickness of the folding over region is smaller than an average thickness of the abutment region.

2. The housing cover in accordance with claim 1, wherein the bend angle is substantially 90°.

3. The housing cover in accordance with claim 1, wherein the bending region ends on an end face with which the housing cover can be placed against the housing.

4. The housing cover in accordance with claim 1, wherein the bend angle is more than 160°.

5. The housing cover in accordance with claim 1, wherein a thickness of the folding over region varies with increasing distance from the bending region.

6. The housing cover in accordance with claim 1, wherein a thickness of the abutment region varies with increasing distance from the bending region.

7. The housing cover in accordance with claim 1, wherein a sum of a local thickness of the folding over region and a local thickness of the abutment region is substantially independent of a distance from the bending region.

8. The housing cover in accordance with claim 1, wherein at least one of a thickness of the folding over region and a thickness of the abutment region is smaller than a thickness of the seal support region at least in sections.

9. The housing cover in accordance with claim 1, wherein the deformation limiting element comprises at least one fastening means through-opening portion, which extends along a circumferential direction of one of the fastening means through-openings over a circumferential angle around the respective fastening means through-opening.

10. The housing cover in accordance with claim 1, wherein the deformation limiting element comprises at least one intermediate fastening means through-opening portion, which extends along a circumferential direction of a rim portion of the housing cover located between two of the fastening means through-openings.

11. The housing cover in accordance with claim 10, wherein at least one of the intermediate fastening means through-opening portions of the deformation limiting element has at least one outlet opening.

12. The housing cover in accordance with claim 10, wherein at least one of the intermediate fastening means through-opening portions of the deformation limiting element ends with at least one outlet opening.

13. The housing cover in accordance with claim 11, wherein the at least one outlet opening is delimited by an intermediate fastening means through-opening portion and by a fastening means through-opening portion of the deformation limiting element.

14. The housing cover in accordance with claim 9, wherein the at least one fastening means through-opening portion of the deformation limiting element comprises a plurality of segments, between which at least one gap is arranged in an initial state of the housing cover before producing the bending region.

15. The housing cover in accordance with claim 14, wherein the segments are pressed together in an operational state of the housing cover.

16. The housing cover in accordance with claim 10, wherein the at least one intermediate fastening means through-opening portion of the deformation limiting element comprises a plurality of segments, between which at least one gap is arranged in an initial state of the housing cover before producing the bending region.

17. The housing cover in accordance with claim 16, wherein the segments are pressed together in an operational state of the housing cover.

\* \* \* \* \*